US012807490B2

(12) United States Patent
Jasinski et al.

(10) Patent No.: US 12,807,490 B2
(45) Date of Patent: Nov. 24, 2026

(54) ALLOYS AS THERMOELECTRIC MATERIALS

(71) Applicant: UNIVERSITY OF LOUISVILLE RESEARCH FOUNDATION, Inc., Louisville, KY (US)

(72) Inventors: Jacek B. Jasinski, Louisville, KY (US); Gamini U. Sumanasekera, Louisville, KY (US); Bhupendra Karki, Louisville, KY (US); Manthila Rajapakse, Louisville, KY (US)

(73) Assignee: UNIVERSITY OF LOUISVILLE RESEARCH FOUNDATION, Inc., Louisville, KY (US)

( * ) Notice: Subject to any disclaimer, the term of this patent is extended or adjusted under 35 U.S.C. 154(b) by 617 days.

(21) Appl. No.: 18/018,470

(22) PCT Filed: Jul. 28, 2021

(86) PCT No.: PCT/US2021/043437
§ 371 (c)(1),
(2) Date: Jan. 27, 2023

(87) PCT Pub. No.: WO2022/026538
PCT Pub. Date: Feb. 3, 2022

(65) Prior Publication Data

US 2024/0051829 A1 Feb. 15, 2024

Related U.S. Application Data

(60) Provisional application No. 63/058,193, filed on Jul. 29, 2020.

(51) Int. Cl.
*C01B 25/08* (2006.01)
*C22C 28/00* (2006.01)
(Continued)

(52) U.S. Cl.
CPC .............. *C01B 25/08* (2013.01); *C22C 28/00* (2013.01); *H10N 10/01* (2023.02);
(Continued)

(58) Field of Classification Search
CPC ....... C01B 25/08; C22C 28/00; C01P 202/50; H10N 10/01; H10N 10/853
See application file for complete search history.

(56) References Cited

U.S. PATENT DOCUMENTS

| | | | | |
|---|---|---|---|---|
| 3,256,702 A * | 6/1966 | Henderson | H10N 10/855 252/62.3 V | |
| 2006/0090787 A1 * | 5/2006 | Onvural | H10N 10/81 136/212 | |

FOREIGN PATENT DOCUMENTS

| | | | |
|---|---|---|---|
| CN | 109706520 | * | 5/2019 |
| CN | 109913946 | * | 6/2019 |

OTHER PUBLICATIONS

Sun et al, “Lattice thermal conductivity of monolayer AsP from first-princle molecular dynamics”, Phys. Chem. Chem. Phys., 2018, 20, 14024-14030, Apr. 25, 2018.*

(Continued)

*Primary Examiner* — C Melissa Koslow
(74) *Attorney, Agent, or Firm* — ALGM LLP; Harry J. Guttman

(57) ABSTRACT

Thermoelectric devices including Arsenic-Phosphorous ($As_xP_{1-x}$) as a source of power, wherein x is a number ranging from 0.1 to 1, are provided. Methods of making crystalline Arsenic-Phosphorous ($As_xP_{1-x}$), wherein x ranges from 0.1 to 1, are also provided. The methods include annealing phosphorous and arsenic at a temperature and under conditions sufficient to produce crystalline formation.

19 Claims, 9 Drawing Sheets

(51) Int. Cl.
*H10N 10/01* (2023.01)
*H10N 10/853* (2023.01)

(52) U.S. Cl.
CPC ....... *H10N 10/853* (2023.02); *C01P 2002/50* (2013.01); *C01P 2002/82* (2013.01); *C01P 2002/90* (2013.01); *C01P 2004/04* (2013.01); *C01P 2006/32* (2013.01); *C01P 2006/40* (2013.01)

(56) References Cited

OTHER PUBLICATIONS

Long et al, "Room temperature high-detectivity mid-infrared photodetectors based on black arsenic phosphorous", Sci. Adv. 2017, 3ed. 1700583, pp. 1-7, Jun. 30, 2017.*

Liu et al, "Black Arsenic-Phpshorus: Layered Anisotropic InfraredSemicondutors with Hightly Tunable Compositions and Properties", Adv. Mater., 2015,27, 44-23-4429, Jun. 25, 2015.*

Splendiani, A.; Sun, L.; Zhang, Y.; Li, T.; Kim, J.; Chim, C.-Y.; Galli, G.; Wang, F. Emerging photoluminescence in monolayer MoS2. Nano Lett. 2010, 10, 1271-1275.

Sugai, S.; Shirotani, I. Raman and infrared reflection spectroscopy in black phosphorus. Solid State Commun. 1985, 53, 753-755.

Sumanasekera, G. U.; Grigorian, L.; Eklund, P. C. Lowtemperature thermoelectrical power measurements using analogue subtraction. Meas. Sci. Technol. 2000, 11, 273.

Sun, J.; Lin, N.; Ren, H.; Tang, C.; Yang, L.; Zhao, X. The electronic structure, mechanical flexibility and carrier mobility of black arsenic-phosphorus monolayers: a first principles study. Phys. Chem. Chem. Phys. 2016, 18, 9779-9787.

Sun, S.; Meng, F.; Wang, H.; Wang, H.; Ni, Y. Novel twodimensional semiconductor SnP3: high stability, tunable bandgaps and high carrier mobility explored using first-principles calculations. J. Mater. Chem. A 2018, 6, 11890-11897.

Sun, Y.; Shuai, Z.; Wang, D. Lattice thermal conductivity of monolayer AsP from first-principles molecular dynamics. Phys. Chem. Chem. Phys. 2018, 20, 14024-14030.

Todosiciuc, A.; Nicorici, A.; Condrea, E.; Warchulska, J. Electrical properties of lead telluride single crystals doped with Gd. CAS 2012 (International Semiconductor Conference), Oct. 15-17, 2012; pp. 269-272.

Triberis, G. P.; Friedman, L. R. The effect of correlations on the conductivity of the small-polaron regime in disordered systems. J. Phys. C: Solid State Phys. 1985, 18, 2281-2286.

Uher, C. Thermopower and thermal conductivity of arsenic from 8K down to 0.3K. J. Phys. F: Met. Phys. 1978, 8, 2559-2567.

Wang, Q. H.; Kalantar-Zadeh, K.; Kis, A.; Coleman, J. N.; Strano, M. S. Electronics and optoelectronics of two-dimensional transition metal dichalcogenides. Nat. Nanotechnol. 2012, 7, 699-712.

Wang, X.; Jones, A. M.; Seyler, K. L.; Tran, V.; Jia, Y.; Zhao, H.; Wang, H.; Yang, L.; Xu, X.; Xia, F. Highly anisotropic and robustexcitons in monolayer black phosphorus. Nat. Nanotechnol. 2015, 10, 517-521.

Wei, P.; Bao, W.; Pu, Y.; Lau, C. N.; Shi, J. Anomalous thermoelectric transport of Dirac particles in graphene. Phys. Rev. Lett. 2009, 102, 166808.

Wood, J. D.; Wells, S. A.; Jariwala, D.; Chen, K.-S.; Cho, E.; Sangwan, V. K.; Liu, X.; Lauhon, L. J.; Marks, T. J.; Hersam, M. C. Effective passivation of exfoliated black phosphorus transistors against ambient degradation. Nano Lett. 2014, 14, 6964-6970.

Xu, Y.; Shi, Z.; Shi, X.; Zhang, K.; Zhang, H. Recent progress in black phosphorus and black-phosphorus-analogue materials: properties, synthesis and applications. Nanoscale 2019, 11, 14491-14527.

Zhang, Y.; Tan, Y.-W.; Stormer, H. L.; Kim, P. Experimental observation of the quantum Hall effect and Berry's phase in graphene. Nature 2005, 438, 201-204.

Zhao, R.; Ahktar, M.; Alruqi, A.; Dharmasena, R.; Jasinski, J. B.; Thantirige, R. M.; Sumanasekera, G. U. Electrical transport properties of graphene nanowalls grown at low temperature using plasma enhanced chemical vapor deposition. Mater. Res. Express 2017, 4, 055007.

Zhao, R.; Jayasingha, R.; Sherehiy, A.; Dharmasena, R.; Akhtar, M.; Jasinski, J. B.; Wu, S.-Y.; Henner, V.; Sumanasekera, G. U. In situ transport measurements and band gap formation of fluorinated graphene. J. Phys. Chem. C 2015, 119, 20150-20155.

Zheng, J.; Yang, Z.; Si, C.; Liang, Z.; Chen, X.; Cao, R.; Guo, Z.; Wang, K.; Zhang, Y.; Ji, J.; Zhang, M.; Fan, D.; Zhang, H. Black phosphorus based all-optical-signal-processing: toward high performances and enhanced stability. ACS Photonics 2017, 4, 1466-1476.

Zhou, Q.; Chen, Q.; Tong, Y.; Wang, J. Light-induced ambient degradation of few-layer black phosphorus: mechanism and protection. Angew. Chem., Int. Ed. 2016, 55, 11437-11441.

Zhou, W.; Zhang, S.; Wang, Y.; Guo, S.; Qu, H.; Bai, P.; Li, Z.; Zeng, H. Anisotropic In-Plane Ballistic Transport in Monolayer Black Arsenic-Phosphorus FETs. Adv. Electron. Mater. 2020, 6, 1901281.

Zhu, H.; McDonnell, S.; Qin, X.; Azcatl, A.; Cheng, L.; Addou, R.; Kim, J.; Ye, P. D.; Wallace, R. M. Al2O3 on black phosphorus by atomic layer deposition: an in situ interface study. ACS Appl. Mater. Interfaces 2015, 7, 13038-13043.

Zuev, Y. M.; Chang, W.; Kim, P. Thermoelectric and magnetothermoelectric transport measurements of graphene. Phys. Rev. Lett. 2009, 102, 096807.

Zvyagin, I. P. On the Theory of Hopping Transport in Disordered Semiconductors. Phys. Status Solidi B 1973, 58, 443 -449.

Akhtar, M.; Anderson, G.; Zhao, R.; Alruqi, A.; Mroczkowska, J. E.; Sumanasekera, G.; Jasinski, J. B. Recent advances in synthesis, properties, and applications of phosphorene. npj 2D Mater. Appl. 2017, 1, 5.

Akhtar, M.; Zhang, C.; Rajapakse, M.; Musa, M. R. K.; Yu, M.; Sumanasekera, G.; Jasinski, J. B. Bilayer phosphorene under high pressure: in situ Raman spectroscopy. Phys. Chem. Chem. Phys. 2019, 21, 7298-7304.

Amani, M.; Regan, E.; Bullock, J.; Ahn, G. H.; Javey, A. Mid-Wave Infrared Photoconductors Based on Black Phosphorus-Arsenic Alloys. ACS Nano 2017, 11, 11724-11731.

Bougiatioti, P.; Manos, O.; Klewe, C.; Meier, D.; Teichert, N.; Schmalhorst, J.-M.; Kuschel, T.; Reiss, G. Electrical transport and optical band gap of NiFe2Ox thin films. J. Appl. Phys. 2017, 122, 225101.

Burns, M. J.; Chaikin, P. M. Interaction effects and thermoelectric power in low-temperature hopping. J. Phys. C: Solid State Phys. 1985, 18, L743-L749.

Choi, S. J.; Kim, B.-K.; Lee, T.-H.; Kim, Y. H.; Li, Z.; Pop, E.; Kim, J.-J.; Song, J. H.; Bae, M.-H. Electrical and Thermoelectric Transport by Variable Range Hopping in Thin Black Phosphorus Devices. Nano Lett. 2016, 16, 3969-3975.

Cutler, M.; Mott, N. F. Observation of Anderson Localization in an Electron Gas. Phys. Rev. 1969, 181, 1336-1340.

Cvijović, D. The Bloch-Gruneisen function of arbitrary order and its series representations. Theor. Math. Phys. 2011, 166, 37-42.

Deng, B.; Tran, V.; Xie, Y.; Jiang, H.; Li, C.; Guo, Q.; Wang, X.; Tian, H.; Koester, S. J.; Wang, H. Efficient electrical control of thinfilm black phosphorus bandgap. Nat. Commun. 2017, 8, 14474.

Dharmasena, R.; Thapa, A. K.; Hona, R. K.; Jasinski, J.; Sunkara, M. K.; Sumanasekera, G. U. Mesoporous TiO2 coating on carbon-sulfur cathode for high capacity Li-sulfur battery. RSC Adv. 2018, 8, 11622-11632.

Doganov, R. A.; Koenig, S. P.; Yeo, Y.; Watanabe, K.; Taniguchi, T.; Özyilmaz, B. Transport properties of ultrathin black phosphorus on hexagonal boron nitride. Appl. Phys. Lett. 2015, 106, 083505.

Fei, R.; Faghaninia, A.; Soklaski, R.; Yan, J.-A.; Lo, C.; Yang, L. Enhanced thermoelectric efficiency via orthogonal electrical and thermal conductances in phosphorene. Nano Lett. 2014, 14, 6393-6399.

Flores, E.; Ares, J. R.; Castellanos-Gomez, A.; Barawi, M.; Ferrer, I. J.; Sanchez, C. Thermoelectric power of bulk blackphosphorus. Appl. Phys. Lett. 2015, 106, 022102.

(56) References Cited

OTHER PUBLICATIONS

Guo, M.; Wang, Z.; Xu, Y.; Huang, H.; Zang, Y.; Liu, C.; Duan, W.; Gan, Z.; Zhang, S.-C.; He, K.; Ma, X.; Xue, Q.; Wang, Y. Tuning thermoelectricity in a Bi2Se3 topological insulator via varied film thickness. New J. Phys. 2016, 18, 015008.

He, Y.; Day, T.; Zhang, T.; Liu, H.; Shi, X.; Chen, L.; Snyder, G. J. High Thermoelectric Performance in Non-Toxic Earth-Abundant Copper Sulfide. Adv. Mater. 2014, 26, 3974-3978.

Heremans, J.; Issi, J.-P.; Rashid, A. A. M.; Saunders, G. A. Electrical and thermal transport properties of arsenic. J. Phys. C: Solid State Phys. 1977, 10, 4511-4522.

Huang, B.; Zhuang, H. L.; Yoon, M.; Sumpter, B. G.; Wei, S.-H. Highly stable two-dimensional silicon phosphides: Different stoichiometries and exotic electronic properties. Phys. Rev. B 2015, 91, No. 121401(R).

Illarionov, Y. Y.; Waltl, M.; Rzepa, G.; Kim, J.-S.; Kim, S.; Dodabalapur, A.; Akinwande, D.; Grasser, T. Long-term stability and reliability of black phosphorus field-effect transistors. ACS Nano 2016, 10, 9543-9549.

Jeavons, A. P.; Saunders, G. A. The Seebeck coefficients and the Fermi energies of arsenic. Solid State Commun. 1970, 8, 995-999.

Jeong, M.-H.; Kwak, D.-H.; Ra, H.-S.; Lee, A.-Y.; Lee, J.-S. Realizing long-term stability and thickness control of black phosphorus by ambient thermal treatment. ACS Appl. Mater. Interfaces 2018, 10, 19069-19075.

Karki, B.; Freelon, B.; Rajapakse, M.; Musa, R.; Riyadh, S. M. S.; Morris, B.; Abu, U.; Yu, M.; Sumanasekera, G.; Jasinski, J. B. Strain-induced vibrational properties of few layer black phosphorus and MoTe2 via Raman spectroscopy. Nanotechnology 2020, 31, 425707.

Kopf, M.; Eckstein, N.; Pfister, D.; Grotz, C.; Krüger, I.; Greiwe, M.; Hansen, T.; Kohlmann, H.; Nilges, T. Access and in situ growth of phosphorene-precursor black phosphorus. J. Cryst. Growth 2014, 405, 6-10.

Lee, H.; Carini, J. P.; Baxter, D. V.; Henderson, W.; Grüner, G. Quantum-critical conductivity scaling for a metal-insulator transition. Science 2000, 287, 633-636.

Li, L.; Engel, M.; Farmer, D. B.; Han, S.-j.; Wong, H.-S. P. High-performance p-type black phosphorus transistor with scandium contact. ACS Nano 2016, 10, 4672-4677.

Li, L.; Yu, Y.; Ye, G. J.; Ge, Q.; Ou, X.; Wu, H.; Feng, D.; Chen, X. H.; Zhang, Y. Black phosphorus field-effect transistors. Nat. Nanotechnol. 2014, 9, 372-377.

Lin, J.-M.; Chen, Y.-C.; Yang, C.-F.; Chen, W. Effect of substrate temperature on the thermoelectric properties of the Sb2Te3 thin films deposition by using thermal evaporation method. J. Nanomater. 2015, 2015, 135130.

Ling, X.; Wang, H.; Huang, S.; Xia, F.; Dresselhaus, M. S. The renaissance of black phosphorus. Proc. Natl. Acad. Sci. U.S.A. 2015, 112, 4523-4530.

Liu, B.; Kopf, M.; Abbas, A. N.; Wang, X.; Guo, Q.; Jia, Y.; Xia, F.; Weihrich, R.; Bachhuber, F.; Pielnhofer, F.; Wang, H.; Dhall, R.; Cronin, S. B.; Ge, M.; Fang, X.; Nilges, T.; Zhou, C. Black arsenic-phosphorus: layered anisotropic infrared semiconductors with highly tunable compositions and properties. Adv. Mater. 2015, 27, 4423-4429.

Liu, Y.; Wang, H.; Wang, S.; Wang, Y.; Wang, Y.; Guo, Z.; Xiao, S.; Yao, Y.; Song, Q.; Zhang, H.; Xu, K. Highly Efficient Silicon Photonic Microheater Based on Black Arsenic-Phosphorus. Adv. Opt. Mater. 2020, 8, 1901526.

Lv, H. Y.; Lu, W. J.; Shao, D. F.; Sun, Y. P. Large thermoelectric power factors in black phosphorus and phosphorene. 2014, arXiv:1404.5171. arXiv preprint.

Ma, X.; Lu, W.; Chen, B.; Zhong, D.; Huang, L.; Dong, L.; Jin, C.; Zhang, Z. Performance change of few layer black phosphorus transistors in ambient. AIP Adv. 2015, 5, 107112.

Marfoua, B.; Hong, J. Transport properties of 2D As1-xPx binary compounds as a potential thermoelectric materials. Phys. E 2019, 111, 79-83.

Mott, N. F. Conduction in non-crystalline materials: III. Localized states in a pseudogap and near extremities of conduction and valence bands. Philos. Mag. 1969, 19, 835-852.

Mott, N. F.; Jones, H. The Theory of the Properties of Metals and Alloys; Dover, 1958; p. 197.

Nolas, G. S.; Sharp, J.; Goldsmid, H. J. Thermoelectrics, Basic Principles and New Materials Developments; Springer: Berlin, 2001. (Table of Contents).

Novoselov, K. S.; Geim, A. K.; Morozov, S. V.; Jiang, D.; Katsnelson, M. I.; Grigorieva, I. V.; Dubonos, S. V.; Firsov, A. A. Twodimensional gas of massless Dirac fermions in graphene. Nature 2005, 438, 197-200.

Overhof, H. Thermopower calculation for variable range hopping 烜 application to $\alpha$-Si. Phys. Status Solidi B 1975, 67, 709-714.

Qin, G.; Yan, Q.-B.; Qin, Z.; Yue, S.-Y.; Cui, H.-J.; Zheng, Q.-R.; Su, G. Hinge-like structure induced unusual properties of black phosphorus and new strategies to improve the thermoelectric performance. Sci. Rep. 2014, 4, 6946.

Radisavljevic, B.; Radenovic, A.; Brivio, J.; Giacometti, V.; Kis, A. Single-layer MoS2 transistors. Nat. Nanotechnol. 2011, 6, 147-150.

Rajapakse, M.; Musa, R.; Abu, U. O.; Karki, B.; Yu, M.; Sumanasekera, G.; Jasinski, J. B. Electrochemical Li Intercalation in Black Phosphorus: In Situ and Ex Situ Studies. J. Phys. Chem. C 2020, 124, 10710-10718.

Rudakov, G. A.; Sosunov, A. V.; Ponomarev, R. S.; Khenner, V. K.; Reza, M. S.; Sumanasekera, G. Synthesis of hollow carbon nanoshells and their application for supercapacitors. Phys. Solid State 2018, 60, 167-172.

Saito, Y.; Iizuka, T.; Koretsune, T.; Arita, R.; Shimizu, S.; Iwasa, Y. Gate-tuned thermoelectric power in black phosphorus. Nano Lett. 2016, 16, 4819-4824.

Sergeev, A.; Mitin, V. Effect of electronic disorder on phonondrag thermopower. Phys. Rev. B 2001, 65, 064301.

Shi, X.; Wang, T.; Wang, J.; Xu, Y.; Yang, Z.; Yu, Q.; Wu, J.; Zhang, K.; Zhou, P. Synthesis of black arsenic-phosphorus and its application for Er-doped fiber ultrashort laser generation. Opt. Mater. Express 2019, 9, 2348-2357.

Sidorov, A. N.; Sherehiy, A.; Jayasinghe, R.; Stallard, R.; Benjamin, D. K.; Yu, Q.; Liu, Z.; Wu, W.; Cao, H.; Chen, Y. P.; Jiang, Z.; Sumanasekera, G. U. Thermoelectric power of graphene as surface charge doping indicator. Appl. Phys. Lett. 2011, 99, 013115.

Smith, B.; Vermeersch, B.; Carrete, J.; Ou, E.; Kim, J.; Mingo, N.; Akinwande, D.; Shi, L. Temperature and Thickness Dependences of the Anisotropic In-Plane Thermal Conductivity of Black Phosphorus. Adv. Mater. 2017, 29, 1603756.

Snyder, G. J.; Toberer, E. S. Complex Thermoelectric Materials. Materials for Sustainable Energy: A Collection of Peer-Reviewed Research and Review Articles from Nature Publishing Group; World Scientific, 2011; pp. 101-110 (also cited as Snyder et al. (2008) "Complex Thermoelectric Materials" Nature Materials, vol. 7, pp. 101-110).

Soleimani, Z.; Zoras, S.; Ceranic, B.; Shahzad, S.; Cui, Y. A review on recent developments of thermoelectric materials for roomtemperature applications. Sustain. Energy Technol. Assess. 2020, 37, 100604.

* cited by examiner

FIG. 2B
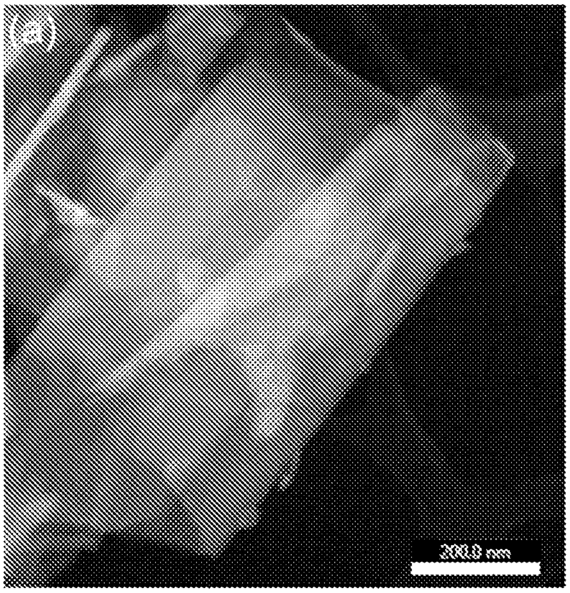
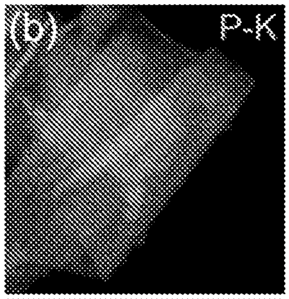
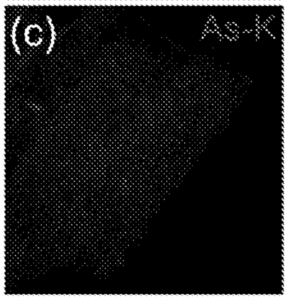
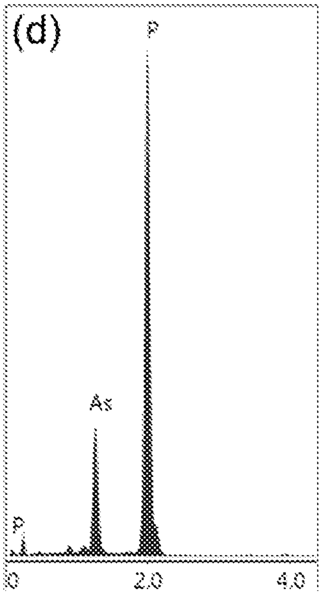
FIG. 2A FIG. 2C FIG. 2D
FIG. 2F
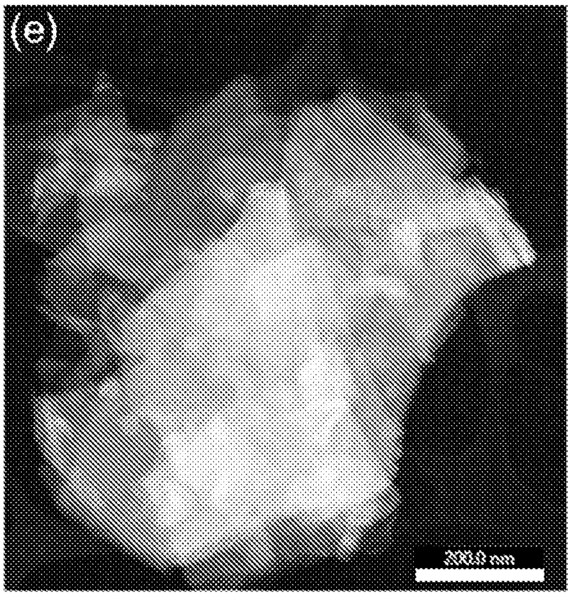
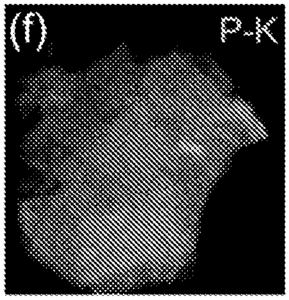
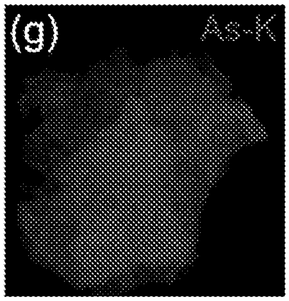
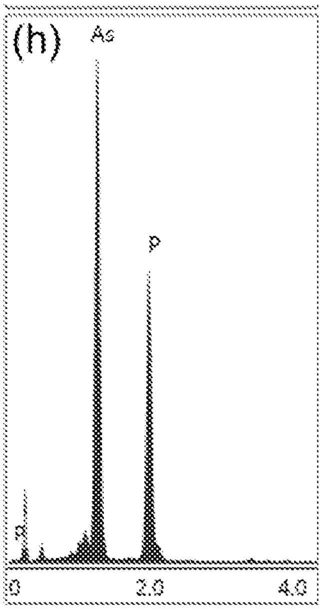
FIG. 2E FIG. 2G FIG. 2H FIG. 3B
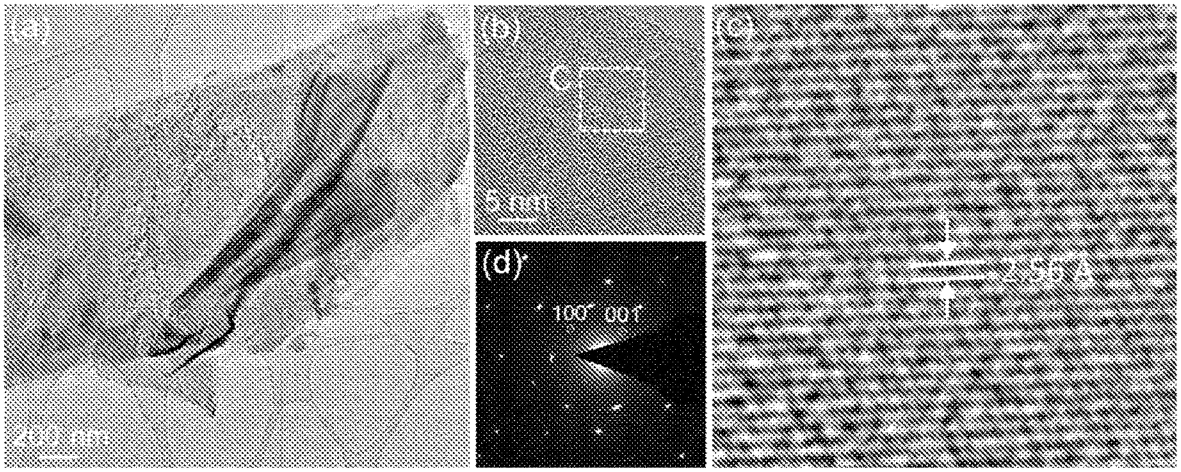
FIG. 3A FIG. 3D FIG. 3C
FIG. 3F
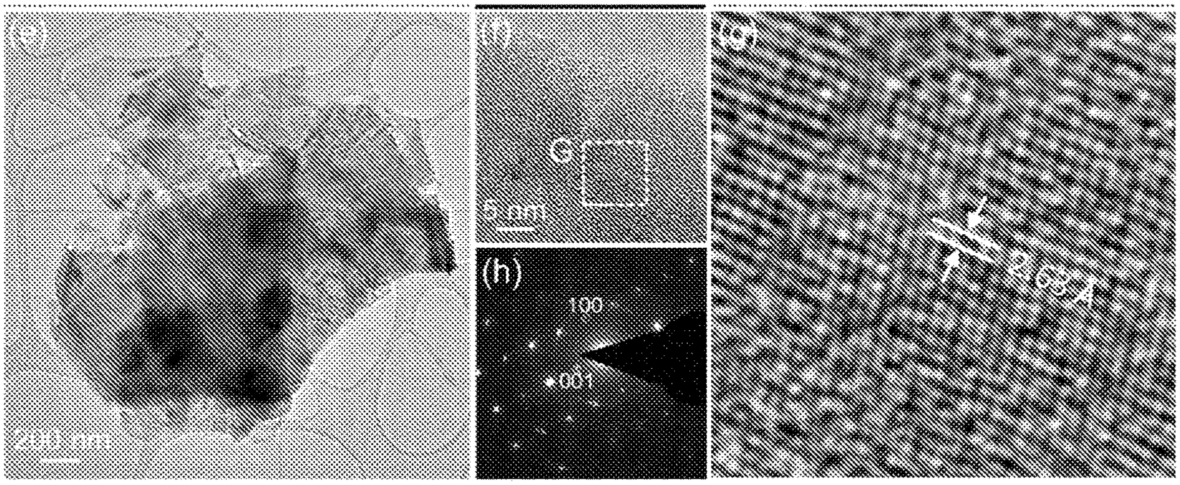
FIG. 3E FIG. 3H FIG. 3G

ALLOYS AS THERMOELECTRIC MATERIALS

STATEMENT REGARDING FEDERALLY SPONSORED RESEARCH OR DEVELOPMENT

This invention was made with government support under Award No. DE-SC0019348 awarded by the U.S. Department of Energy. The government has certain rights in the invention.

FIELD OF THE INVENTION

The invention generally relates to Arsenic-Phosphorous ($As_xP_{1-x}$) as a new class of thermoelectric alloys with high thermopower value.

BACKGROUND OF THE INVENTION

Due to the rapid growth in the information technology industry and other related fields, there is an ever-increasing demand for new thermoelectric (TE) materials, which are essential for the compactness and fast operation of modern electronic devices. Thermoelectric devices are used mostly for heating/cooling purposes, or for power generation. The main challenge for thermoelectric device design is the device performance, and the compromise between material parameters to increase performance. The attempts to increase the performance of thermoelectric materials and devices are many including doping engineering, synthesizing new materials, and optimizing material parameters.

In the search for these novel TE materials, two-dimensional (2D) materials have garnered tremendous attention due to some unique features such as higher carrier mobility, thickness-dependent band gap tunability and in-plane anisotropy of many thermal, optical, and electrical properties[3-8]. Since the introduction of graphene, which arguably is the most investigated and documented 2D material to date, an array of new 2D materials, including transition metal dichalcogenides (TMDs) and hexagonal boron nitride (h-BN) came following by, and the family of 2D materials is constantly expanding. Although graphene and TMDs have intriguing properties, their applications in electronics industry are somewhat restricted by the zero bandgap of graphene and poor carrier mobility of TMDs[9]. This is where phosphorene, which is the 2D counterpart of black phosphorus, has triggered research interest in the recent past. Mainly due to properties such as layer-dependent tunable band gap (ranging from 0.3 eV to 1.5 eV (from bulk to monolayer))[10-11] and higher field-effect hole mobility (1000 $cm^2V^{-1}s^{-1}$)[10, 12-14], phosphorene has been identified and implemented as a good material candidate for novel electronics applications[15]. More importantly, the puckered structure of layers makes phosphorene highly anisotropic with mutually orthogonal electronic and thermal transport directions, which is greatly beneficial for thermoelectric applications[3, 16-20].

Despite the fact that phosphorene has many interesting properties, large scale production of few-layer phosphorene still poses a great challenge[9]. Phosphorene is unstable and tends to degrade under ambient conditions, which restrict its usage in some applications[9, 21-24]. Different scientific approaches have been conducted to eradicate this issue by means of surface passivation, in which a dielectric layer is being used to protect the surface of phosphorene[23, 25-27], but merely covering the surface may not be the solution for all situations.

Black Phosphorus (BP), an allotrope of phosphorus, has recently attracted increasing attention owing to its unique properties such as high carrier mobility, unique in-plane anisotropic structure and tunable direct bandgap. Nevertheless, there are some limitations in its application in devices due to its environmental instability.

In view of the limitations of prior work, improved thermoelectric materials are still needed.

SUMMARY

Embodiments of the disclosure provide a new class of thermoelectric alloys comprising black Arsenic-Phosphorous ($As_xP_{1-x}$) as thermoelectric materials. Advantageous properties of these alloys include, but are not limited to, high thermoelectric power, high power factor, greater stability, and use as high-performance thermoelectric materials.

One aspect of the disclosure provides a powered device comprising crystalline Arsenic-Phosphorous ($As_xP_{1-x}$) configured for use as a power source, wherein x is a number from 0.1 to 1 and at least one device operably connected to receive and use power produced by the power source. In some embodiments, the power source produces thermoelectric power. In some embodiments, the $As_xP_{1-x}$ is configured for use as a cooling/heating element or as a heat conversion and power generation structure. In some embodiments, $As_xP_{1-x}$ is the sole source of power for the device. In some embodiments, $As_xP_{1-x}$ is combined with another active thermoelectric material. In some embodiments, the device is a car or truck. In some embodiments, the device is an aircraft engine. In some embodiments, the device performs a heating or cooling operation. In some embodiments, x is one of 0.2, 0.5, and 0.83. In some embodiments, $As_xP_{1-x}$ is synthesized from grey arsenic and red phosphorus.

Another aspect of the disclosure provides a method of making crystalline Arsenic-Phosphorous ($As_xP_{1-x}$), wherein x ranges from 0.1 to 1, comprising annealing phosphorous and arsenic at a temperature and under conditions sufficient to produce crystalline formation. In some embodiments, the arsenic is grey arsenic and the phosphorous is red phosporous. In some embodiments, the annealing is performed under vacuum. In some embodiments, the annealing is performed at a temperature of at least 600° C. In some embodiments, x is one of 0.2, 0.5, and 0.83.

BRIEF DESCRIPTION OF THE DRAWINGS

FIGS. 2A-H. STEM-HAADF images (a), (e), P—K and As—K elemental maps (b-c), (f-g) and EDX spectra (right column) of $As_{0.2}P_{0.8}$ (d) and $As_{0.5}P_{0.5}$ (h) alloys.

FIGS. 3A-H. TEM characterization of $As_{0.2}P_{0.8}$ (top panel) and $As_{0.5}P_{0.5}$ (bottom panel) alloys: (a), (e) Low-magnification TEM images, (b-c), (f-g) HRTEM images, (d), (h) SAED patterns.

vs temperature with theoretical fits. (b) shows a blown-up view of the upper three curves.

Figure 7A:
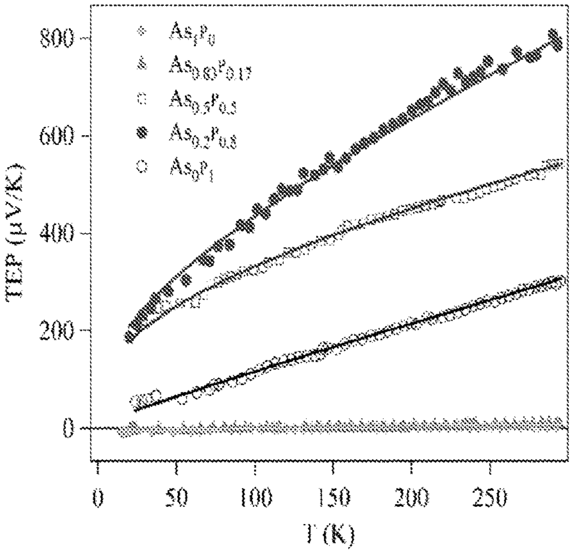
Figure 7B:
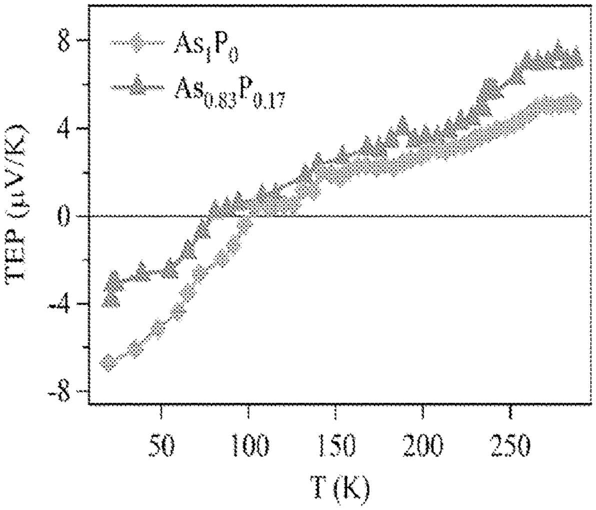

FIGS. 7A-B. (a) Plot of TEP vs temperature with theoretical fits. (b) shows the blown-up view of the results for the two samples with high Arsenic concentration (x=1 and 0.83).

Figure 8:
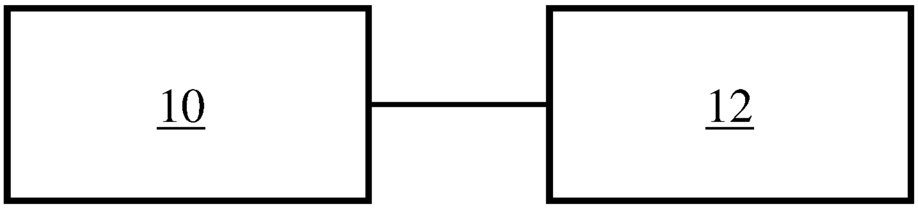

FIG. 8. A powered device and power source according to some embodiments of the disclosure.

Figure 9A:
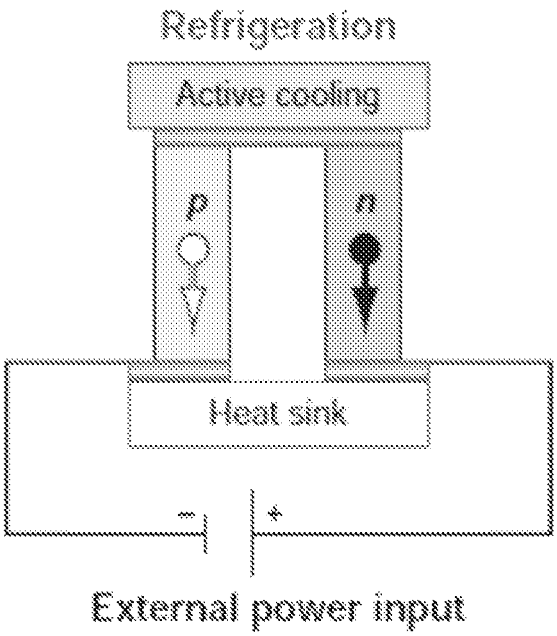
Figure 9B:
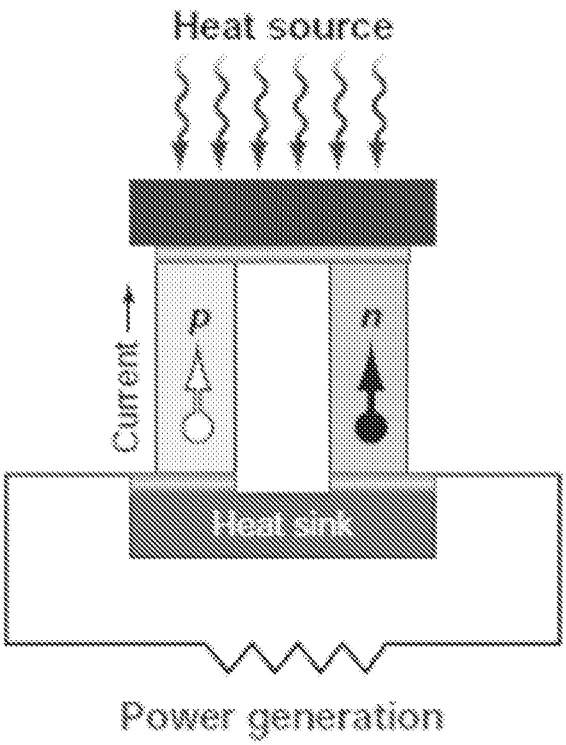

FIGS. 9A-B. Thermoelectric refrigeration and powergeneration. A single thermoelectric couple is shown, configured for refrigeration (A) or power generation (B). The labels p (positive) and n (negative) refer to the sign of the charge carriers in each leg; open circles correspond to holes and filled circles to electrons.

DETAILED DESCRIPTION

Aspects of the disclosure provide thermoelectric materials comprising Arsenic-Phosphorous ($As_xP_{1-x}$) alloys. These thermoelectric materials have a number of applications ranging from thermoelectric generators to thermoelectric cooling and heating devices. This is due to their inherent capabilities of converting thermal to electrical energy and vice versa, which provides significant contributions in addressing the energy and environmental crisis.

With reference to FIG. 8, the alloys described herein may be incorporated into thermoelectric devices as the source of power. Embodiments include a powered device 10 operably connected to receive and use power produced by a power source 12 comprising an Arsenic-Phosphorous ($As_xP_{1-x}$) alloy. Embodiments provide two types of thermoelectric devices: (1) devices configured for active refrigeration (based on Peltier effect) or heating and (2) devices configured for waste heat energy harvesting and the electric power generation (based on Seebeck effect).

An exemplary device is a thermoelectric generator (TEG), also called a Seebeck generator). A TEG is a solid-state device that converts heat flux (temperature differences) directly into electrical energy through a phenomenon called the Seebeck effect (a form of thermoelectric effect). Thermoelectric generators function like heat engines but are less bulky and have no moving parts which produces a more reliable device that does not require maintenance for long periods. Thermoelectric generators do not require any fluids for fuel or cooling, making them non-orientation dependent allowing for use in zero-gravity or deep-sea applications.

Thermoelectric power generators as disclosed herein may contain three major components: Arsenic-Phosphorous ($As_xP_{1-x}$) alloys as the thermoelectric materials, thermoelectric modules, and thermoelectric systems that interface with the heat source. The thermoelectric materials (Arsenic-Phosphorous ($As_xP_{1-x}$) alloys) generate power directly from the heat by converting temperature differences into electric voltage. These materials have both high electrical conductivity ($\sigma$) and low thermal conductivity ($\theta$). Efficiency and TE performance of these materials are characterized by the dimensionless temperature dependent quantity $ZT=S^2\sigma T/k$, where S, $\sigma$, T, and k are Seebeck coefficient (thermoelectric power), electrical conductivity, temperature, and thermal conductivity, respectively. Thermal conductivity has the contribution from both electrons and phonons so, $k=k_e+k_l$[1]. In order to improve the thermoelectric performance, it is necessary to have a lower thermal conductivity and the suitable combination of electrical conductivity and electrical thermal conductivity[2] or in other words higher power factor ($S^2\sigma$).

A thermoelectric module is a circuit containing thermoelectric materials (Arsenic-Phosphorous ($As_xP_{1-x}$) alloys) which generate electricity from heat directly. A thermoelectric module may comprise two dissimilar thermoelectric materials joined at their ends: an n-type (with negative charge carriers), and a p-type (with positive charge carriers) semiconductor (FIG. 9). Direct electric current will flow in the circuit when there is a temperature difference between the ends of the materials. Generally, the current magnitude is directly proportional to the temperature difference: $J=-\sigma S\Delta T$ where $\sigma$ is the local conductivity, S is the Seebeck coefficient (also known as thermopower), a property of the local material, and $\Delta T$ is the temperature gradient.

Using thermoelectric modules, a thermoelectric system generates power by taking in heat from a source such as a hot exhaust flue. To operate, the system needs a large temperature gradient. The cold side may be cooled by air or water. Heat exchangers may be used on both sides of the modules to supply this heating and cooling.

With reference to FIG. 9, thermoelectric modules may use two types of semiconductor "legs" that are connected in series. Negatively charged electrons carry electrical current in the n-type, leg, whereas positively charged holes carry the current in the p-type leg. Refrigeration is possible because electrons and holes carry heat as well as electrical charge. An external battery forces the hot electrons and holes away from the cold side of the device (FIG. 9A), resulting in cooling. If heat is applied to only one side of the device, a voltage develops across the n and p legs that can be used to convert part of the heat into electrical power (FIG. 9B).

The thermoelectric materials described herein provide an environmentally friendly solution for direct and reversible conversion between heat and electricity and provide solutions for sustainable energy sources. The thermoelectric materials have broad applications in areas of cutting down waste and increasing energy efficiency. Currently, large amounts of energy are wasted in heat. The transportation and industrial sector, in particular, generates large amounts of high-temperature heat, a significant portion of which can be converted into electrical energy within the constraint of Carnot efficiency.

Applications of thermoelectric generators as described herein include, but are not limited to, as a power source or power harvester for gas pipelines, for example, for cathodic protection, radio communication, and telemetry; remote and off-grid power generators for unmanned sites; back-up power for solar photovoltaic systems; space probes; and cars, trucks, and other automobiles which produce waste heat (in the exhaust and the cooling agents). Harvesting that heat energy using a thermoelectric generator can increase the fuel efficiency of the car. Thermoelectric generators may replace the alternators in cars to reduce fuel consumption by around 10% or more. In addition to automobiles, waste heat is also generated in many other places, such as in industrial processes and heating (wood stoves, outdoor boilers, cooking, oil and gas fields, pipelines, power plants, and remote communication towers), aircraft engines, ship incinerators, coolers, and microprocessors. Photovoltaic generators may be improved by adding a thermoelectric device or by concentrating sunrays directly onto a thermoelectric module.

Crystalline Arsenic-Phosphorous ($As_xP_{1-x}$) alloys as described herein represent a new class of thermoelectric materials. In some embodiments, x is a number from 0.1 to 1, e.g. 0.2, 0.5, or 0.83. The alloy may be incorporated into a powered device as described herein as a source of power, e.g. thermoelectric power, for the device. In some embodiments, the alloy is the sole source of power. In some embodiments, $As_xP_{1-x}$ is combined with another active thermoelectric material. Since $As_xP_{1-x}$ is a good p-type thermoelectric material, it can be combined with a good n-type thermoelectric material such as PbTe or $Bi_2Te_3$.

Embodiments also include methods of making crystalline Arsenic-Phosphorous ($As_xP_{1-x}$) alloys. Techniques such as a chemical vapor transport growth technique may be used. The methods may comprise annealing phosphorous and arsenic at a temperature and under conditions sufficient to produce crystalline formation. In some embodiments, the annealing is performed at a temperature of at least about 600° C., e.g. at least about 625° C. or 650° C. The annealing may be performed under vacuum, e.g. a vacuum of at least about $10^{-6}$ Torr. Mineralization additives such as Sn and $SnI_4$ may be added to enhance the growth of $As_xP_{1-x}$ crystals. A temperature gradient between hot and cold ends of the reaction vessel should be maintained, e.g. a gradient of at least about 40° C., e.g. 45° C. or 50° C. Crystal growth occurs at the cold end. The $As_xP_{1-x}$ alloys described herein may be comprised of particles that are clusters of flakes in the size range from tens of nanometers to several micrometers, e.g. from 10 nm to 10 μm.

The synthesis method described herein allows making $As_xP_{1-x}$ alloys with different chemical compositions in order to tune thermoelectric properties by simply changing the stoichiometric ratio of starting materials. The same synthesis route and temperature profile can be used for all alloys. The thermoelectric power of black phosphorus can be increased from 300 μV/k to 803 μV/k with a doping of Arsenic.

In some embodiments, the arsenic is grey arsenic and the phosphorous is red phosporous. Red phosphorus may be formed by heating white phosphorus to 300° C. (572° F.) in the absence of air or by exposing white phosphorus to sunlight. Red phosphorus exists as an amorphous network. Upon further heating, the amorphous red phosphorus crystallizes. Red phosphorus does not ignite in air at temperatures below 240° C. (464° F.), whereas pieces of white phosphorus ignite at about 30° C. (86° F.). Grey arsenic adopts a double-layered structure comprising many interlocked, ruffled, six-membered rings. Because of weak bonding between the layers, grey arsenic is brittle and has a relatively low Mohs hardness of 3.5. Grey arsenic is a semimetal, but becomes a semiconductor with a bandgap of 1.2-1.4 eV if amorphized. Grey arsenic is also the most stable form.

Before exemplary embodiments of the present invention are described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

The invention is further described by the following non-limiting examples which further illustrate the invention, and are not intended, nor should they be interpreted to, limit the scope of the invention.

EXAMPLE

Summary

Here, we report the structural and temperature dependent transport properties of $As_xP_{1-x}$ (x=0, 0.2, 0.5, 0.83, 1) alloys. It is observed that black phosphorous (BP)-related phonon modes in the alloy samples are red-shifted with increasing arsenic concentration, while black arsenic-related modes in these samples are blue-shifted with increasing phosphorus concentration. As the arsenic concentration, x increases from 0 to 1, the 4-probe resistance of the $As_xP_{1-x}$ alloys is found to decrease by more than 3 orders of magnitude. The transport studies reveal that samples with the highest arsenic concentration (x=1 and 0.83) show metallic behavior in the temperature dependence of resistance with a small thermopower at room temperature with an anomalous temperature dependence. In contrast, the samples with high phosphorus concentration (x=0, 0.2, and 0.5) show very large thermopower values at room temperature reaching a value as high as 803 μV/k for x=0.2. The temperature dependence of the thermopower of these samples can be well described by the variable range hopping (VRH) mechanism in two-dimensions (2-d), $S \sim T^{1/3}$. Similarly, their 4-probe resistance (R) values can be fitted with 2-d VRH mechanism, $R \sim \exp(T^{1/3})$.

Materials and Methods

Synthesis of $As_xP_{1-x}$ Compounds

A series of $As_xP_{1-x}$ compounds with different atomic compositions (x=0, 0.2, 0.5, 0.83, 1) were synthesized from red phosphorus and grey arsenic by chemical vapor transport growth method. Stoichiometric ratios of red phosphorus (Sigma, >97%) and grey arsenic (Sigma, 99.99%) with a total weight of 500 mg were annealed inside evacuated ($10^{-6}$ Torr), sealed quartz ampoules at 650° C. Sn (20 mg, Alfa Aesar, 99.8%) and $SnI_4$ (10 mg, Alfa Aesar, >95%) were added as mineralization additives. A temperature gradient of 50° C. was maintained between the hot and cold ends of the ampoule throughout the annealing process in order to facilitate vapor transport and resultant $As_xP_{1-x}$ alloy crystals were grown at the cold end. Previous works[30-31] show similar synthesis approaches which have been used to synthesize $As_xP_{1-x}$ crystals with different compositions, and this technique is genuinely inspired by chemical vapor transport growth of BP itself[37-38].

Characterization

The $As_xP_{1-x}$ alloys were thoroughly characterized using several techniques. Raman spectra were measured to characterize vibrational modes using Renishaw inVia with 632 nm He—Ne laser. Transmission electron microscopy (TEM) was used to characterize the morphology, crystal structure and chemical composition of selected $As_xP_{1-x}$ alloys, namely alloys with nominal compositions of $As_{0.2}P_{0.8}$ and $As_{0.5}P_{0.5}$. TEM specimens were prepared by pulverizing these materials and dispersing them onto holey carbon coated TEM grids. A comprehensive TEM analysis, including TEM and high-resolution TEM (HRTEM) imaging, selected area electron diffraction (SAED), scanning TEM (STEM)-High-Annular Angle Dark Filed (HAADF) imaging, Energy Dispersive X-ray Spectroscopy (EDX), and elemental mapping, was performed using a 200 kV filed emission gun Tecnai F20 Transmission Electron Microscope (FEI, Inc.), equipped with a 2048×2048 CCD camera (Gatan, Inc.), a HAADF detector (E.A. Fischione Instruments, Inc.), and TEAM EDX analysis system (EDAX, Inc.). The morphology and elemental composition of the alloy samples was also characterized using scanning electron microscopy (SEM) and SEM-based EDX. These measurements were performed using Tescan Vega 3 system, equipped with EDAX EDX detector.

Electrical Transport Measurements

Figure 4A:
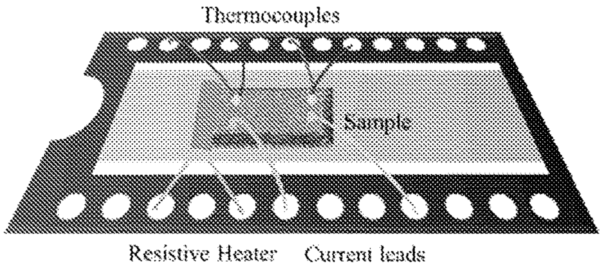
FIGS. 4A-D. (a) Schematic diagram of the sample holder with electrical contacts. (b) Detailed schematic circuit diagram of sample showing two thermocouples (Chromel (KP)/Au:Fe), resistive heater and additional leads for thermopower and 4-probe resistance measurements. (c) Temperature dependence of the 4-probe resistance and (d) thermopower of $As_xP_{1-x}$ alloys.
Figure 4B:
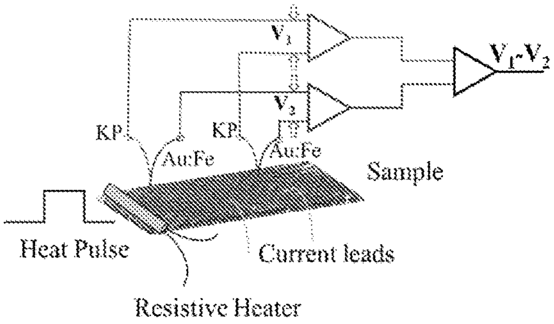
Figure 4C:
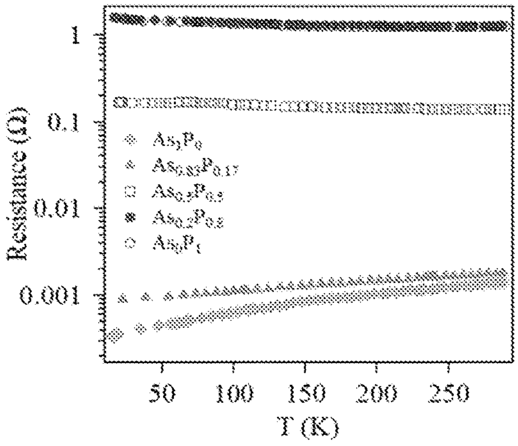
Figure 4D:
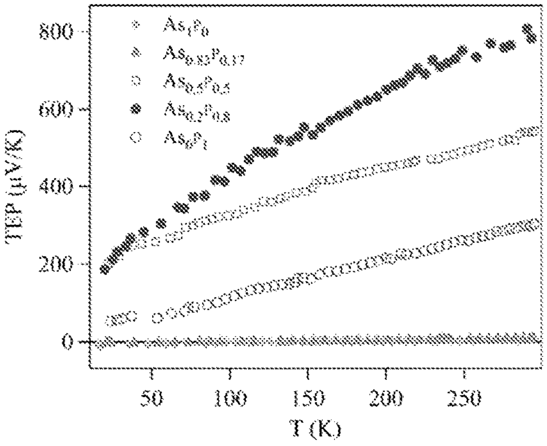

Transport properties of all the samples were measured by anchoring two miniature thermocouples (Chromel (KP)/Au-7 at. % Fe (Au:Fe); 100 μm diameter), two additional current leads, and a resistive heater (see the schematic diagram of FIG. 4A). Thicknesses of the AsP alloys used for the transport measurement were~800 microns with lateral dimension of 2-3 mm The DC resistance, R was measured with a standard four-probe technique and the thermopower, S was measured by the analog subtraction method. To measure S, a temperature difference (ΔT<1 K) was generated across the sample by applying a voltage pulse to the heater. The typical heating power was <10 mW, and the pulse duration was 3-5 s. The slope of the thermoelectric voltage (ΔV) versus temperature difference (ΔT) due to the heat pulse was used to obtain S at a given temperature. For R measurement, an excitation current was applied through the two current leads and the voltage across the two thermocouple wires was measured in van der Pauw configuration[39]. The excitation current level was kept extremely low to avoid Joule-heating especially at low temperatures. Further experimental details are described in ref[40-43]. The S and R of all the samples were measured over a temperature range of 15-300 K. A chip carrier supporting the sample was attached to the copper cold finger of a closed cycled refrigerator (Janis Research Co. CCS-350ST-H) which could be cooled down to a base temperature of ~10 K.

Results and Discussion

Figure 1B:
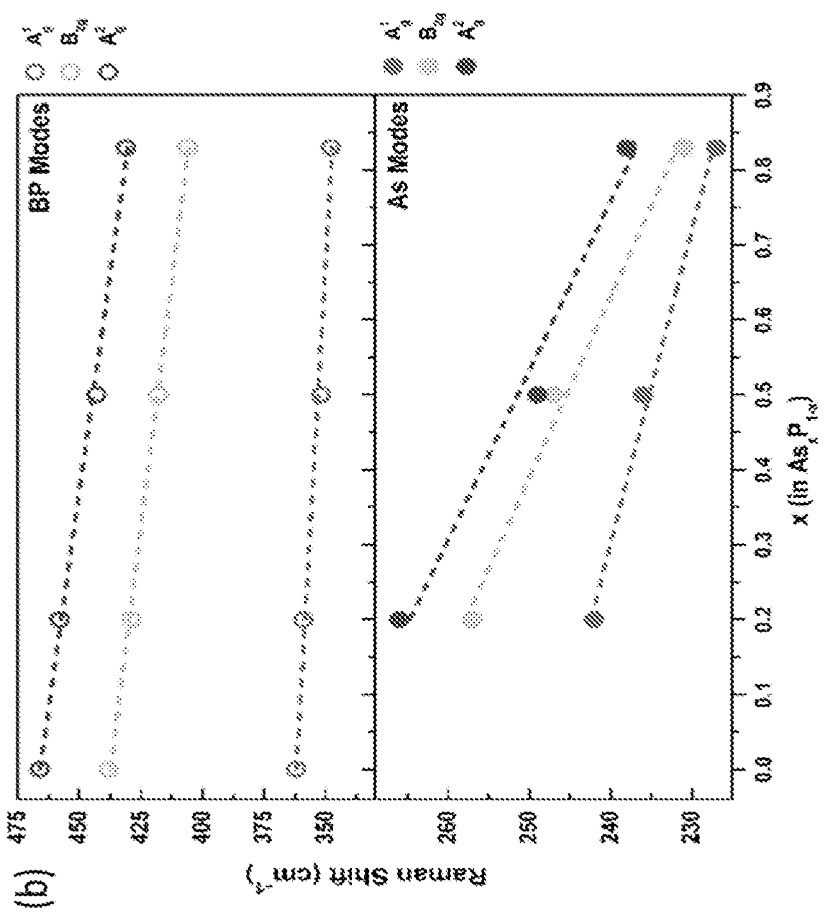
FIGS. 1A-B. (a) Raman spectra for pristine BP, grey As, and $As_xP_{1-x}$ alloys with different chemical compositions. (b) Raman shift vs arsenic concentration (x) for P-P (top) and As—As (bottom) vibrational modes. Dotted lines provide guide to the eye with linear fits.
Figure 1A:
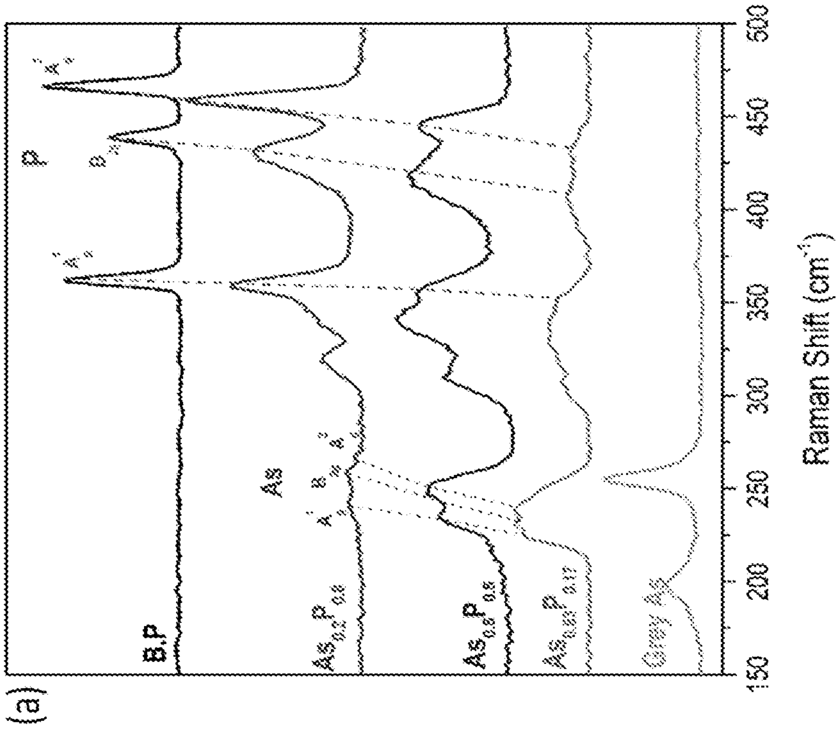

Raman spectra obtained for grey As, BP, and different $As_xP_{1-x}$ alloys are shown in FIG. 1*a*. Pristine BP has 3 main Raman modes, $A^1_g$, $B_{2g}$ and $A^2_g$ which corresponds to out-of-plane vibrations, in-plane vibrations along zigzag direction and in-plane vibrations along armchair direction respectively[38, 44]. But for alloy samples which have both As and P atoms, it was observed that the Raman spectra consisted of peaks not only from P—P vibrations, but also from As—P and As—As vibrations.

The spectral range of Raman spectra for a given $As_xP_{1-x}$ alloy can be split into three main frequency regimes. For the series of alloys, high frequency region (>350 $cm^{-1}$) contains peaks from P—P atomic vibrations, whereas low frequency region (<270 $cm^{-1}$) contains peaks from As—As atomic vibrations. For each alloy sample, three peaks in the low frequency region can be identified as $A^1_g$, $B_{2g}$ and $A^2_g$ modes for As—As vibrations. The identification of As—As vibrational modes is analogous to the work reported by Liu et al[30] in 2015. Modes arising from heteroatomic As—P vibrations can be observed in the mid-frequency region (270 $cm^{-1}$ to 350 $cm^{-1}$). As arsenic concentration of the alloy increases, a decrease in peak intensities for P—P vibrational modes were observed, whereas peak intensities corresponding to As—As vibrations were increased. It is reasonable because P-P vibrations become less prominent when more P atoms are replaced by As atoms in the lattice. It is also observed that peaks of alloy samples are red shifted (w.r.t BP sample) with increasing arsenic concentration (FIG. 1*b*).

Raman spectroscopic data shows that both As—As and P—P phonon modes undergo a red-shift with increasing As concentration. It was also observed that for P—P vibrations, modes $B_{2g}$ and $A^2_g$ shift more than $A^1_g$ with increasing As concentration, by factors of 2.2 and 2.4 respectively. This observation is noteworthy and intriguing as we observed similar trends in Li-intercalated BP with increasing Li concentration (by a factor~1.5)[45] as well as BP under increasing uniaxial strain (by a factor~1.4)[46].

FIG. 2 shows the morphology and chemical composition of typical particles of $As_xP_{1-x}$ alloys, as obtained from STEM-HAADF and EDX analysis. It was observed that the particles were clusters of flakes in the size range from tens of nanometers to several micrometers. The phosphorus (P—K) and arsenic (As—K) elemental maps showed relatively homogenous distribution of both elements within the particles. However, for the $As_{0.2}P_{0.8}$ sample, the intensity of the As—K map was much lower than that of the P—K map, while for the $As_{0.5}P_{0.5}$ sample the intensities of both maps were comparable. This was consistent with the nominal composition of these alloys and it was further confirmed by the relative peak intensity of the P—K and As—K lines in corresponding EDX spectra.

The morphology and structure was further analyzed using (HR)TEM and SAED and typical results obtained from this study are presented FIG. 3.

Firstly, the flake morphology was confirmed and HRTEM images of individual flakes showed large single-crystalline areas with lattice fringes, which corresponded to the orthorhombic puckered structure. SAED patterns of individual flakes were predominantly single crystalline in nature and showed the symmetry consistent with the same type of crystal structure, i.e., orthorhombic puckered structure with the Cmca space group, which is characteristic for black phosphorus. However, these measurements showed a systematic expansion of the crystal structure with the increase of arsenic concentration, x. This can be seen from HRTEM and SAED data summarized in Table 1, where d-spacing values of several low-index planes, their relative changes, as well as the measured c/a ratio of the in-plane lattice parameters are shown. Using this data, one can calculate the average relative change of d-spacing and obtain values of 0, 0.011, and 0.033 for $As_0P_1$, $As_{0.2}P_{0.8}$, and $As_{0.5}P_{0.5}$, respectively. The dependence can be fitted well with a proportional function described by relative lattice expansion coefficient of 0.0645. In addition, the data suggest some anisotropy of the crystal structure in-plane expansion. Specifically, the lattice increase along the c-axis was stronger than along the a-axis (see the last column in Table 1). This is consistent with the crystal structure and easy deformation direction of the orthorhombic puckered structure. Recently, we have seen similar behavior for the Li-intercalated black phosphorus[45].

TABLE 1

Values of d-spacing measured from HRTEM and SAED, their relative changes as compared to black phosphorus, and the c/a ratio of in-plane lattice parameters.

| x | $As_xP_{1-x}$ | HRTEM $d_{111}$ [Å] | $d_{111}/d_{111,BP}$ | SAED $d_{100}$ [Å] | $d_{100}/d_{100,BP}$ | $d_{001}$ [Å] | $d_{001}/d_{001,BP}$ | c/a |
|---|---|---|---|---|---|---|---|---|
| 0 | $As_0P_1$ | 2.54 | 1 | 3.31 | 1 | 4.37 | 1 | 1.32 |
| 0.2 | $As_{0.2}P_{0.8}$ | 2.56 | 1.010 | 3.35 | 1.012 | 4.42 | 1.011 | 1.32 |
| 0.5 | $As_{0.5}P_{0.5}$ | 2.63 | 1.035 | 3.38 | 1.021 | 4.55 | 1.041 | 1.35 |

At a larger scale, alloyed materials were found to be polycrystalline, as shown by HRTEM and SAED. In addition, domains of different orientations inside larger grains, extended structural defects, such as dislocations, and structural inhomogeneity, such as heavily distorted atomic planes, were often seen in HRTEM images. The high concentration of structural defects and lattice distortions were also reflected in the arcing of diffraction spots in SAED patterns recorded from larger sample areas.

The layered morphology and relatively uniform elemental composition were confirmed for all alloyed materials. Besides, the average compositions, as measured by SEM-EDX, were in agreement with the nominal compositions. However, the composition distribution within different grains, characterized by the standard deviation of about 0.05 was measured for these samples.

The temperature dependence of 4-probe resistance and thermopower of each sample are shown in FIG. 4. As seen in FIG. 4*c*, both pure arsenic and $As_{0.83}P_{0.17}$ samples showed metallic temperature behavior with a decrease in resistance as the temperature decreased in the entire temperature range. As the arsenic concentration (x in $As_xP_{1-x}$) decreased, the samples showed a transition to a semiconducting (activated) behavior with an increase in resistance for the temperature decrease, especially in the low temperature regime. Moreover, as x changed from 0 to 1, the resistance was found to decrease by more than 3 orders of magnitude. Further, as shown in FIG. 4*d*, both pure arsenic and $As_{0.83}P_{0.17}$ samples showed very small TEP values (~7 μV/K) at room temperature, consistent with their metallic nature. As the x decreased to 0.5, TEP value increased to ~+550 μV/K and eventually reached a value as high as +803 μV/K for x=0.2. However, when x decreased to 0 (BP), TEP value decreased to +323 μV/K, consistent with published literature values for black phosphorus[47-48]. A comparison plot showing the loop used for calculating TEP of $As_xP_{1-x}$ alloys was generated. The thermopower remains positive in the entire temperature range for samples with x=0, 0.2, and 0.5. However, for samples with x=0.83 and 1.0, the sign of the thermopower changes from positive to negative at low temperatures.

Figure 5:
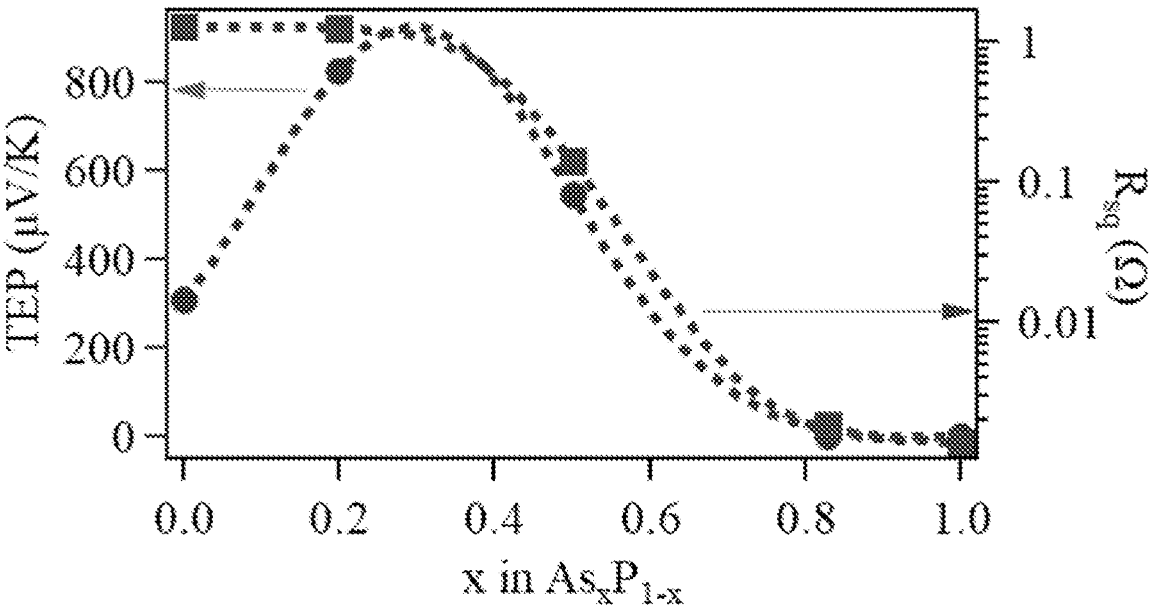
FIG. 5. Effect of As concentration on the room temperature TEP (left axis) and 4-probe resistance (right axis).
Figure 6A:
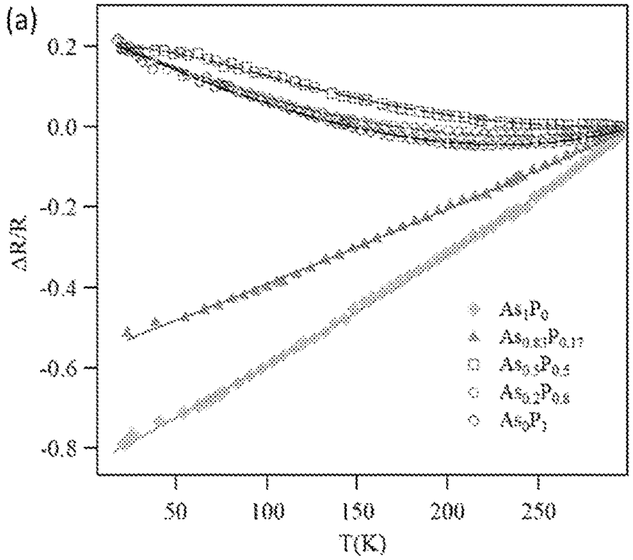
FIGS. 6A-B. (a) Plot of normalized resistance, $$\frac{\Delta R}{R} = \frac{R(T) - R(RT)}{R(RT)}$$

The concentration dependence of both the TEP and the 4-probe resistance is plotted in FIG. 5. The dotted lines are guides to the eye. It can be inferred from the plots that both the TEP and the resistance reach maximum values at an arsenic composition, x~0.2. In order to understand the transport mechanism, we developed a framework for the temperature dependence of both R and S. In FIG. 6, we have plotted the normalized resistance, $$\frac{\Delta R}{R} = \frac{R(T) - R(RT)}{R(RT)},$$

where R (RT) is the resistance at room temperature. The solid lines are the fits to the appropriate theory. The electrical resistivity, ρ of most pure metals/semimetals is predominantly due to electron-phonon scattering. The standard theory developed for scattering of charge carriers by acoustical phonons leads to the $$\text{Grüneisen expression}^{49}: \rho \sim \left(\frac{T}{T_R}\right)^5 \int_0^{\frac{T_R}{T}} \frac{x^5}{(e^x - 1)(1 - e^{-x})} dx;$$

where $T_R$ is the Bloch-Grüneisen temperature which is approximately equal to the Debye temperature ($\theta_D$). At low temperatures ($T<T_R$), this theory predicts a $T^5$ dependence of ρ, through the combined effect of the density of phonons, increasing with $T^3$ and the effectiveness of their collisions with electrons, which is a function of the scattering angle and increases as $T^2$. At high temperatures ($T>>T_D$,) most interactions give large angle scattering, and the density of interacting phonons varies as T, since the number of modes that can interact with the electrons is limited to modes of energy<$k_B T_D$[50] giving rise to a linear T dependence.

For pure arsenic and $As_{0.83}P_{0.17}$ samples, resistance can be very well fitted with $R=aT+bT^3$ relationship, which accounts for linear temperature (T) dependence at high temperatures and $T^3$ dependence at low temperatures due to phonon scattering (lower two curves)[51].

Figure 6B:
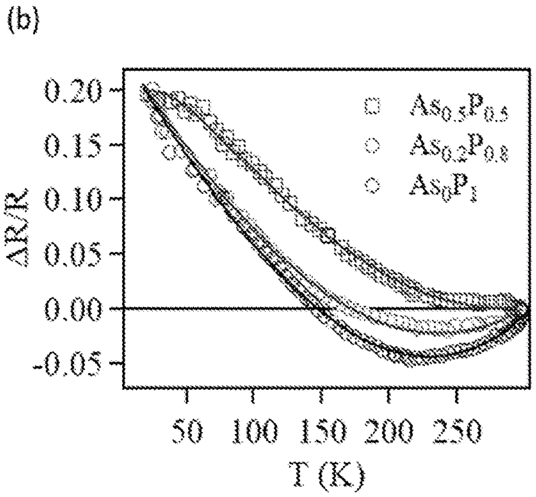

The data for x=0, 0.2, and 0.5 (top three curves in FIG. 6*a*) samples are shown in FIG. 6*b* in a blown-up scale for clarity. They show a rather anomalous behavior. Generally, for semiconductors, the band conduction governs the charge transport properties at high temperature. In band conduction, charge carriers from localized states are thermally activated and transported to the delocalized states[52]. However, in deformed or disordered materials at relatively low temperature, the charge carriers hop through localized states without excitation to the conduction band. Overall, there are mainly two types of conduction mechanisms in such materials, namely (a) band conduction or thermal activation and (b) hopping. This hopping mechanism can be further subdivided into two types: (i) nearest-neighbor-hopping (NNH) and (ii) variable-range-hopping (VRH) and the universal equation governing these conduction mechanisms in semiconductors is given by $\sigma\sim\exp(-T^{-p})$, where p defines a specific mechanism based upon the density of states at Fermi level. For band conduction p=1, and for variable range hopping p lies between 0 and 1 and the transport of charge requires a conduction mechanism through localized states via nearest NNH and VRH. In general, VRH relationship between conductance and temperature can be expressed for various spatial dimensions as $\sigma\sim\mathrm{Exp}[-T^{-(1/(d+1))}]$, where d is the spatial dimension. Based on 2-d VRH mechanism, the resistance data were fitted with $\Delta R/R=aT+b\,\mathrm{Exp}(T^{-1/3})$ function. The linear T dependence accounts for the metallic behavior at high temperatures, while exponential term stems from the Mott's variable range hopping mechanism with $R=R_0\,\mathrm{Exp}(T_0/T)^{1/3}$ in 2-dimension[53].

FIG. 7*a* shows the temperature dependence of TEP with appropriate theoretical fits. The diffusion term of the thermopower is generally expressed as (Mott formula), $$S=\frac{\pi^2}{3e}k_B^2T\left.\frac{\partial(\ln\sigma(E))}{\partial E}\right|_{E_F}$$

where the thermopower is proportional to the energy derivative of the electronic density of states (DOS) at Fermi energy $E_F$[54-56]. For conventional nondegenerate semiconductors, S is inversely proportional to the temperature and expressed as $$S=\frac{k_B}{e}\left(\frac{E_C-E_F}{k_BT}+const\right)$$

where $E_C$ is the energy at the conduction band edge[57]. Various theoretical behaviors have been found for the thermopower in the variable range hopping regime. Cutler and Mott have predicted a linear variation with temperature T of the thermopower: S~T[58]. Zvyagin, Overhof and Mott[59-61] showed that $S\sim T^{1/2}$. Triberis and Friedman[62] have found $S\sim T^{1/4}$. In general, using the Mott formula, and the general expression for the conductivity for a given spatial dimension, it can be shown that $S\sim T^{(d-1)/(d+1)}$[63].

The S(T) data for the samples with x=0, 0.2, and 0.5 were fitted with $S(T)\sim aT^{1/3}$. Again, the $T^{1/3}$ dependence of the S originates from the 2D Motts variable range hopping (VRH) mechanism[53]. The data at high temperatures can be fitted quite reasonably with the theory with S→0 as T→0. A blown-up view of the data for x=1 and 0.83 is presented in FIG. 7*b*. The temperature dependence of thermopower for both samples show a negative sign of the thermopower at low temperatures. This sign change in thermopower can be qualitatively explained within the framework of a two-band model facilitating two-carrier conduction allowing for the overlap of two types of carriers with opposite sign (electrons and holes). At the compensation temperature, the Seebeck coefficient vanishes yielding intrinsic conduction. In that case, the electrical resistivity should display a maximum due to minimum carrier density. In this model, the total electrical conductivity ($\sigma_{total}$) and total thermopower ($S_{total}$) are given by $\sigma_{total}=\sigma_e+\sigma_h$ and $S_{total}=(\sigma_eS_e+\sigma_hS_e)/(\sigma_e+\sigma_h)$ where the subscripts h and e refer to holes and electrons, respectively. The total thermopower is determined by the compensation of partial thermopower weighted by the partial conductivity of holes and electrons. Modification of the Fermi surface when the Fermi level, $E_F$ lies deep in the band (metallic) or the change in the band structure at higher levels of As can also play a role in the reversal of the sign of the thermopower. The work by Jeavons et al.[64] shows the temperature dependence of the $S_{11}$ and $S_{33}$ components of the Seebeck coefficient tensor (only down to 77 K). According to them, $S_{11}$ shows a positive (linear dependence with temperature) values while $S_{33}$ shows negative values in the temperature region between 77K-300 K. In a follow up work, Heremans et al.[51] show the temperature dependence of $S_{11}$ down to ~2.5 K. They show that $S_{11}$ has a small negative value at low temperatures; undergoes a change of sign at ~16 K; exhibits a positive maximum at ~30 K; decreases towards a minimum at ~60 K; and finally rises smoothly to a positive value at higher temperatures. Uher has measured $S_{11}$ of arsenic down to 0.3 K and shown that below 2 K the thermopower is due to carrier diffusion and follows a linear temperature dependence while phonon drag is important at higher temperatures[50]. Our results for x=1 and 0.83 are somewhat closer to the results by Heremans et al. except for the positive hump. This may be because our thermopower measurement is not in a specific crystalline direction (random).

Table 2 summarizes the electronic transport properties (Seebeck coefficient S, resistivity ρ and power factor (PF) of the $As_xP_{1-x}$ alloys and other thermoelectric materials. Room temperature transport results for BP (x=0) shows the Seebeck coefficient S to be 323 μV/K and electrical resistivity 4.66E-03 Ωm, which result in the power factor (PF) of 22.38 $\mu Wm^{-1}K^{-2}$. Moreover, at room temperature, the large power factor of 316.54 $\mu Wm^{-1}K^{-2}$ was reached for $As_{0.5}P_{0.5}$ sample. Plot of effect of As concentration on the Residual-resistance ratio (RRR) of the AsP alloys and the temperature dependence of power factor of $As_{0.5}P_{0.5}$ benchmarked with $Bi_2Se_3$[65] were examined This suggests that the thermoelectric properties of the BP can be improved by doping, resulting in comparable or even better performance than some of the reported outstanding thermoelectric materials. However, it should be pointed out that extended defects present inside the measured polycrystalline alloy samples could contribute to the thermopower[66].

TABLE 2

Room temperature electronic transport properties (S, ρ and PF) of $As_xP_{1-x}$ alloys.

| | | | Room Temperature | |
|---|---|---|---|---|
| | | | Resistivity $(\rho) = \frac{\pi t R}{ln2}$ | $PF = \frac{S^2}{\rho}$ |
| S.N. | Compound | TEP (S) [μV/K] | [Ωm] | [$\mu W m^{-1} K^{-2}$] |
| 1. | $As_0P_1$ [a]) | 323.0 | 4.66E−03 | 22.38 |
| 2. | $As_{0.2}P_{0.8}$ [a]) | 803.0 | 5.85E−03 | 110.26 |
| 3. | $As_{0.5}P_{0.5}$ [a]) | 550.9 | 9.59E−04 | 316.54 |
| 4. | $As_{0.83}P_{0.17}$ [a]) | 7.4 | 8.34E−06 | 6.57 |
| 5. | $As_{1.0}P_0$ [a]) | 5.2 | 5.22E−06 | 5.18 |
| 6. | $Bi_2Te_3$ [67] | −105.0 | 6.3E−04 | 17.5 |
| 7. | $Bi_2Se_3$ [65, 67] | −105.0 | 1.92E−05 | 575.0 |
| 8. | PbTe [68] | 451.0 | 4.34E−04 | 4.68 |
| 9. | $Cu_2S$ [69] | 290.0 | 6.7E−04 | 125.52 |
| 10. | $Sb_2Te_3$ [70] | 129.3 | 4.68E−04 | 357.0 |

[a]) Our work.

Conclusions

In summary, we have synthesized and conducted a comparative study of structural and transport properties of a series of $As_xP_{1-x}$ alloys. Raman spectroscopy demonstrated the existence of 3 types of atomic vibrational (phonon) modes arising from As—As bonding (<270 $cm^{-1}$), As—P bonding (270 $cm^{-1}$-350 $cm^{-1}$) and P—P bonding (>350 $cm^{-1}$). Phonon modes were found to be red shifted with increasing As concentration. This is due to the changes in bond strengths and bond lengths occurring when P atoms are being substituted by As atoms. TEM characterization shows that these alloys comprise clusters of flakes ranging from few tens of nanometers to few micrometers in size. The alloyed samples showed the layered morphology and relatively uniform composition. They were found to crystallize in the orthorhombic puckered structure and the systematic expansion of the lattice structure with the increase of arsenic concentration was observed. At a smaller scale, individual flakes showed a mono-crystalline orthorhombic crystal structure analogous to BP, but at a larger scale it was found to be more polycrystalline in nature. Formations of differently oriented domains were found even within the grains of a specific orientation. Furthermore, high resolution imaging reveals an abundant presence of structural defects and lattice distortions in the alloys, and the relationship between these defects and composition of alloys is yet to be studied differently. Transport studies have shown that samples with the higher concentrations of arsenic (x=0.83 and 1) exhibited an anomalous temperature dependence at low temperature and a metallic behavior with negligible thermopower at room temperature. On the other hand, room temperature thermopower measurement of the samples with lower As concentration (x=0, 0.2 and 0.5) showed the very high thermopower (as high as 803 μV/k for x=0.2). The temperature dependence of the thermopower also can be fitted with 2-d VRH mechanism, $S\sim T^{1/3}$. It was observed that the 4-probe resistance decreased by more than 3 orders of magnitude as As concentration increases. The lower As concentration samples was fitted well with 2-d VRH mechanism, $R\sim\exp(T^{-1/3})$ whereas the higher As concentration samples showed low 4-probe resistance values and displayed metallic behavior with almost linear temperature dependence.

REFERENCES (1) Snyder, G. J.; Toberer, E. S. Complex Thermoelectric Materials. Materials for Sustainable Energy: A Collection of Peer-Reviewed Research and Review Articles from Nature Publishing Group; World Scientific, 2011; pp 101-110.

(2) Marfoua, B.; Hong, J. Transport properties of 2D As1-xPx binary compounds as a potential thermoelectric materials. Phys. E 2019, 111, 79-83.

(3) Sun, Y.; Shuai, Z.; Wang, D. Lattice thermal conductivity of monolayer AsP from first-principles molecular dynamics. Phys. Chem. Chem. Phys. 2018, 20, 14024-14030.

(4) Novoselov, K. S.; Geim, A. K.; Morozov, S. V.; Jiang, D.; Katsnelson, M. I.; Grigorieva, I. V.; Dubonos, S. V.; Firsov, A. A. Twodimensional gas of massless Dirac fermions in graphene. Nature 2005, 438, 197-200.

(5) Zhang, Y.; Tan, Y.-W.; Stormer, H. L.; Kim, P. Experimental observation of the quantum Hall effect and Berry's phase in graphene. Nature 2005, 438, 201-204.

(6) Radisavljevic, B.; Radenovic, A.; Brivio, J.; Giacometti, V.; Kis, A. Single-layer MoS2 transistors. Nat. Nanotechnol. 2011, 6, 147-150.

(7) Splendiani, A.; Sun, L.; Zhang, Y.; Li, T.; Kim, J.; Chim, C.-Y.; Galli, G.; Wang, F. Emerging photoluminescence in monolayer MoS2. Nano Lett. 2010, 10, 1271-1275.

(8) Wang, Q. H.; Kalantar-Zadeh, K.; Kis, A.; Coleman, J. N.; Strano, M. S. Electronics and optoelectronics of two-dimensional transition metal dichalcogenides. Nat. Nanotechnol. 2012, 7, 699-712.

(9) Xu, Y.; Shi, Z.; Shi, X.; Zhang, K.; Zhang, H. Recent progress in black phosphorus and black-phosphorus-analogue materials: properties, synthesis and applications. Nanoscale 2019, 11, 14491-14527.

(10) Li, L.; Yu, Y.; Ye, G. J.; Ge, Q.; Ou, X.; Wu, H.; Feng, D.; Chen, X. H.; Zhang, Y. Black phosphorus field-effect transistors. Nat. Nanotechnol. 2014, 9, 372-377.

(11) Wang, X.; Jones, A. M.; Seyler, K. L.; Tran, V.; Jia, Y.; Zhao, H.; Wang, H.; Yang, L.; Xu, X.; Xia, F. Highly anisotropic and robustexcitons in monolayer black phosphorus. Nat. Nanotechnol. 2015, 10, 517-521.

(12) Doganov, R. A.; Koenig, S. P.; Yeo, Y.; Watanabe, K.; Taniguchi, T.; Özyilmaz, B. Transport properties of ultrathin black phosphorus on hexagonal boron nitride. Appl. Phys. Lett. 2015, 106, 083505.

(13) Deng, B.; Tran, V.; Xie, Y.; Jiang, H.; Li, C.; Guo, Q.; Wang, X.; Tian, H.; Koester, S. J.; Wang, H. Efficient electrical control of thinfilm black phosphorus bandgap. Nat. Commun. 2017, 8, 14474.

(14) Li, L.; Engel, M.; Farmer, D. B.; Han, S.-j.; Wong, H.-S. P. High-performance p-type black phosphorus transistor with scandium contact. ACS Nano 2016, 10, 4672-4677.

(15) Ling, X.; Wang, H.; Huang, S.; Xia, F.; Dresselhaus, M. S. The renaissance of black phosphorus. Proc. Natl. Acad. Sci. U.S.A. 2015, 112, 4523-4530.

(16) Smith, B.; Vermeersch, B.; Carrete, J.; Ou, E.; Kim, J.; Mingo, N.; Akinwande, D.; Shi, L. Temperature and Thickness Dependences of the Anisotropic In-Plane Thermal Conductivity of Black Phosphorus. Adv. Mater. 2017, 29, 1603756.

(17) Fei, R.; Faghaninia, A.; Soklaski, R.; Yan, J.-A.; Lo, C.; Yang, L Enhanced thermoelectric efficiency via orthogonal electrical and thermal conductances in phosphorene. Nano Lett. 2014, 14, 6393-6399.

(18) Lv, H. Y.; Lu, W. J.; Shao, D. F.; Sun, Y. P. Large thermoelectric power factors in black phosphorus and phosphorene. 2014, arXiv:1404.5171. arXiv preprint.

(19) Qin, G.; Yan, Q.-B.; Qin, Z.; Yue, S.-Y.; Cui, H.-J.; Zheng, Q.-R.; Su, G. Hinge-like structure induced unusual properties of black phosphorus and new strategies to improve the thermoelectric performance. Sci. Rep. 2014, 4, 6946.
(20) Akhtar, M.; Anderson, G.; Zhao, R.; Alruqi, A.; Mroczkowska, J. E.; Sumanasekera, G.; Jasinski, J. B. Recent advances in synthesis, properties, and applications of phosphorene. npj 2D Mater. Appl. 2017, 1, 5.
(21) Zhou, Q.; Chen, Q.; Tong, Y.; Wang, J. Light-induced ambient degradation of few-layer black phosphorus: mechanism and protection. Angew. Chem., Int. Ed. 2016, 55, 11437-11441.
(22) Ma, X.; Lu, W.; Chen, B.; Zhong, D.; Huang, L.; Dong, L.; Jin, C.; Zhang, Z. Performance change of few layer black phosphorus transistors in ambient. AIP Adv. 2015, 5, 107112.
(23) Zheng, J.; Yang, Z.; Si, C.; Liang, Z.; Chen, X.; Cao, R.; Guo, Z.; Wang, K.; Zhang, Y.; Ji, J.; Zhang, M.; Fan, D.; Zhang, H. Black phosphorus based all-optical-signal-processing: toward high performances and enhanced stability. ACS Photonics 2017, 4, 1466-1476.
(24) Jeong, M.-H.; Kwak, D.-H.; Ra, H.-S.; Lee, A.-Y.; Lee, J.-S. Realizing long-term stability and thickness control of black phosphorus by ambient thermal treatment. ACS Appl. Mater. Interfaces 2018, 10, 19069-19075.
(25) Zhu, H.; McDonnell, S.; Qin, X.; Azcatl, A.; Cheng, L.; Addou, R.; Kim, J.; Ye, P. D.; Wallace, R. M. Al2O3 on black phosphorus by atomic layer deposition: an in situ interface study. ACS Appl. Mater. Interfaces 2015, 7, 13038-13043.
(26) Illarionov, Y. Y.; Waltl, M.; Rzepa, G.; Kim, J.-S.; Kim, S.; Dodabalapur, A.; Akinwande, D.; Grasser, T. Long-term stability and reliability of black phosphorus field-effect transistors. ACS Nano 2016, 10, 9543-9549.
(27) Wood, J. D.; Wells, S. A.; Jariwala, D.; Chen, K.-S.; Cho, E.; Sangwan, V. K.; Liu, X.; Lauhon, L. J.; Marks, T. J.; Hersam, M. C. Effective passivation of exfoliated black phosphorus transistors against ambient degradation. Nano Lett. 2014, 14, 6964-6970.
(28) Huang, B.; Zhuang, H. L.; Yoon, M.; Sumpter, B. G.; Wei, S.-H. Highly stable two-dimensional silicon phosphides: Different stoichiometries and exotic electronic properties. Phys. Rev. B 2015, 91, No. 121401(R).
(29) Sun, S.; Meng, F.; Wang, H.; Wang, H.; Ni, Y. Novel twodimensional semiconductor SnP3: high stability, tunable bandgaps and high carrier mobility explored using first-principles calculations. J. Mater. Chem. A 2018, 6, 11890-11897.
(30) Liu, B.; Köpf, M.; Abbas, A. N.; Wang, X.; Guo, Q.; Jia, Y.; Xia, F.; Weihrich, R.; Bachhuber, F.; Pielnhofer, F.; Wang, H.; Dhall, R.; Cronin, S. B.; Ge, M.; Fang, X.; Nilges, T.; Zhou, C. Black arsenic-phosphorus: layered anisotropic infrared semiconductors with highly tunable compositions and properties. Adv. Mater. 2015, 27, 4423-4429.
(31) Shi, X.; Wang, T.; Wang, J.; Xu, Y.; Yang, Z.; Yu, Q.; Wu, J.; Zhang, K.; Zhou, P. Synthesis of black arsenic-phosphorus and its application for Er-doped fiber ultra-short laser generation. Opt. Mater. Express 2019, 9, 2348-2357.
(32) Liu, Y.; Wang, H.; Wang, S.; Wang, Y.; Wang, Y.; Guo, Z.; Xiao, S.; Yao, Y.; Song, Q.; Zhang, H.; Xu, K. Highly Efficient Silicon Photonic Microheater Based on Black Arsenic-Phosphorus. Adv. Opt. Mater. 2020, 8, 1901526.
(33) Marfoua, B.; Hong, J. Transport properties of 2D As1-xPx binary compounds as a potential thermoelectric materials. Phys. E 2019, 111, 79-83.
(34) Dharmasena, R.; Thapa, A. K.; Hona, R. K.; Jasinski, J.; Sunkara, M. K.; Sumanasekera, G. U. Mesoporous TiO2 coating on carbon-sulfur cathode for high capacity Li-sulfur battery. RSC Adv. 2018, 8, 11622-11632.
(35) Zhou, W.; Zhang, S.; Wang, Y.; Guo, S.; Qu, H.; Bai, P.; Li, Z.; Zeng, H. Anisotropic In-Plane Ballistic Transport in Monolayer Black Arsenic-Phosphorus FETs. Adv. Electron. Mater. 2020, 6, 1901281.
(36) Amani, M.; Regan, E.; Bullock, J.; Ahn, G. H.; Javey, A. Mid-Wave Infrared Photoconductors Based on Black Phosphorus-Arsenic Alloys. ACS Nano 2017, 11, 11724-11731.
(37) Sun, J.; Lin, N.; Ren, H.; Tang, C.; Yang, L.; Zhao, X. The electronic structure, mechanical flexibility and carrier mobility of black arsenic-phosphorus monolayers: a first principles study. Phys. Chem. Chem. Phys. 2016, 18, 9779-9787.
(38) Rudakov, G. A.; Sosunov, A. V.; Ponomarev, R. S.; Khenner, V. K.; Reza, M. S.; Sumanasekera, G. Synthesis of hollow carbon nanoshells and their application for supercapacitors. Phys. Solid State 2018, 60, 167-172.
(39) Köpf, M.; Eckstein, N.; Pfister, D.; Grotz, C.; Krüger, I.; Greiwe, M.; Hansen, T.; Kohlmann, H.; Nilges, T. Access and in situ growth of phosphorene-precursor black phosphorus. J. Cryst. Growth 2014, 405, 6-10.
(40) Akhtar, M.; Zhang, C.; Rajapakse, M.; Musa, M. R. K.; Yu, M.; Sumanasekera, G.; Jasinski, J. B. Bilayer phosphorene under high pressure: in situ Raman spectroscopy. Phys. Chem. Chem. Phys. 2019, 21, 7298-7304.
(41) Lee, H.; Carini, J. P.; Baxter, D. V.; Henderson, W.; Grüner, G. Quantum-critical conductivity scaling for a metal-insulator transition. Science 2000, 287, 633-636.
(42) Sidorov, A. N.; Sherehiy, A.; Jayasinghe, R.; Stallard, R.; Benjamin, D. K.; Yu, Q.; Liu, Z.; Wu, W.; Cao, H.; Chen, Y. P.; Jiang, Z.; Sumanasekera, G. U. Thermoelectric power of graphene as surface charge doping indicator. Appl. Phys. Lett. 2011, 99, 013115.
(43) Sumanasekera, G. U.; Grigorian, L.; Eklund, P. C. Lowtemperature thermoelectrical power measurements using analogue subtraction. Meas. Sci. Technol. 2000, 11, 273.
(44) Zhao, R.; Ahktar, M.; Alruqi, A.; Dharmasena, R.; Jasinski, J. B.; Thantirige, R. M.; Sumanasekera, G. U. Electrical transport properties of graphene nanowalls grown at low temperature using plasma enhanced chemical vapor deposition. Mater. Res. Express 2017, 4, 055007.
(45) Zhao, R.; Jayasingha, R.; Sherehiy, A.; Dharmasena, R.; Akhtar, M.; Jasinski, J. B.; Wu, S.-Y.; Henner, V.; Sumanasekera, G. U. In situ transport measurements and band gap formation of fluorinated graphene. J. Phys. Chem. C 2015, 119, 20150-20155.
(46) Sugai, S.; Shirotani, I. Raman and infrared reflection spectroscopy in black phosphorus. Solid State Commun. 1985, 53, 753-755.
(47) Rajapakse, M.; Musa, R.; Abu, U. O.; Karki, B.; Yu, M.; Sumanasekera, G.; Jasinski, J. B. Electrochemical Li Intercalation in Black Phosphorus: In Situ and Ex Situ Studies. J. Phys. Chem. C 2020, 124, 10710-10718.

(48) Karki, B.; Freelon, B.; Rajapakse, M.; Musa, R.; Riyadh, S. M. S.; Morris, B.; Abu, U.; Yu, M.; Sumanasekera, G.; Jasinski, J. B. Strain-induced vibrational properties of few layer black phosphorus and MoTe2 via Raman spectroscopy. Nanotechnology 2020, 31, 425707.

(49) Flores, E.; Ares, J. R.; Castellanos-Gomez, A.; Barawi, M.; Ferrer, I. J.; Sánchez, C. Thermoelectric power of bulk blackphosphorus. Appl. Phys. Lett. 2015, 106, 022102.

(50) Saito, Y.; Iizuka, T.; Koretsune, T.; Arita, R.; Shimizu, S.; Iwasa, Y. Gate-tuned thermoelectric power in black phosphorus. Nano Lett. 2016, 16, 4819-4824.

(51) Cvijovié, D. The Bloch-Gruneisen function of arbitrary order and its series representations. Theor. Math. Phys. 2011, 166, 37-42.

(52) Uher, C. Thermopower and thermal conductivity of arsenic from 8K down to 0.3K. J. Phys. F: Met. Phys. 1978, 8, 2559-2567.

(53) Heremans, J.; Issi, J.-P.; Rashid, A. A. M.; Saunders, G. A. Electrical and thermal transport properties of arsenic. J. Phys. C: Solid State Phys. 1977, 10, 4511-4522.

(54) Bougiatioti, P.; Manos, O.; Klewe, C.; Meier, D.; Teichert, N.; Schmalhorst, J.-M.; Kuschel, T.; Reiss, G. Electrical transport and optical band gap of NiFe2Ox thin films. J. Appl. Phys. 2017, 122, 225101.

(55) Choi, S. J.; Kim, B.-K.; Lee, T.-H.; Kim, Y. H.; Li, Z.; Pop, E.; Kim, J.-J.; Song, J. H.; Bae, M.-H. Electrical and Thermoelectric Transport by Variable Range Hopping in Thin Black Phosphorus Devices. Nano Lett. 2016, 16, 3969-3975.

(56) Mott, N. F. Conduction in non-crystalline materials: III. Localized states in a pseudogap and near extremities of conduction and valence bands. Philos. Mag. 1969, 19, 835-852.

(57) Wei, P.; Bao, W.; Pu, Y.; Lau, C. N.; Shi, J. Anomalous thermoelectric transport of Dirac particles in graphene. Phys. Rev. Lett. 2009, 102, 166808.

(58) Zuev, Y. M.; Chang, W.; Kim, P. Thermoelectric and magnetothermoelectric transport measurements of graphene. Phys. Rev. Lett. 2009, 102, 096807.

(59) Mott, N. F.; Jones, H. The Theory of the Properties of Metals and Alloys; Dover, 1958; p 197.

(60) Nolas, G. S.; Sharp, J.; Goldsmid, H. J. Thermoelectrics, Basic Principles and New Materials Developments; Springer: Berlin, 2001.

(61) Cutler, M.; Mott, N. F. Observation of Anderson Localization in an Electron Gas. Phys. Rev. 1969, 181, 1336-1340.

(62) Zvyagin, I. P. On the Theory of Hopping Transport in Disordered Semiconductors. Phys. Status Solidi B 1973, 58, 443-449.

(63) Overhof, H. Thermopower calculation for variable range hopping □ application to α-Si. Phys. Status Solidi B 1975, 67, 709-714.

(64) Mott, N. F.; Davis, E. Electronic Processes in Non-crystalline Materials; Clarendon: Oxford, 1979.

(65) Triberis, G. P.; Friedman, L. R. The effect of correlations on the conductivity of the small-polaron regime in disordered systems. J. Phys. C: Solid State Phys. 1985, 18, 2281-2286.

(66) Burns, M. J.; Chaikin, P. M. Interaction effects and thermoelectric power in low-temperature hopping. J. Phys. C: Solid State Phys. 1985, 18, L743-L749.

(67) Jeavons, A. P.; Saunders, G. A. The Seebeck coefficients and the Fermi energies of arsenic. Solid State Commun. 1970, 8, 995-999.

(68) Guo, M.; Wang, Z.; Xu, Y.; Huang, H.; Zang, Y.; Liu, C.; Duan, W.; Gan, Z.; Zhang, S.-C.; He, K.; Ma, X.; Xue, Q.; Wang, Y. Tuning thermoelectricity in a Bi2Se3 topological insulator via varied film thickness. New J. Phys. 2016, 18, 015008.

(69) Sergeev, A.; Mitin, V. Effect of electronic disorder on phonondrag thermopower. Phys. Rev. B 2001, 65, 064301.

(70) Soleimani, Z.; Zoras, S.; Ceranic, B.; Shahzad, S.; Cui, Y. A review on recent developments of thermoelectric materials for roomtemperature applications. Sustain. Energy Technol. Assess. 2020, 37, 100604.

(71) Todosiciuc, A.; Nicorici, A.; Condrea, E.; Warchulska, J. Electrical properties of lead telluride single crystals doped with Gd. CAS 2012 (International Semiconductor Conference), Oct. 15-17, 2012; pp 269-272.

(72) He, Y.; Day, T.; Zhang, T.; Liu, H.; Shi, X.; Chen, L.; Snyder, G. J. High Thermoelectric Performance in Non-Toxic Earth-Abundant Copper Sulfide. Adv. Mater. 2014, 26, 3974-3978.

(73) Lin, J.-M.; Chen, Y.-C.; Yang, C.-F.; Chen, W. Effect of substrate temperature on the thermoelectric properties of the Sb2Te3 thin films deposition by using thermal evaporation method. J. Nanomater. 2015, 2015, 135130.

While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

We claim:

1. A thermoelectric device configured for use as a cooling/heating element, wherein the thermoelectric device comprises crystalline $As_xP_{1-x}$ and x is from 0.1 to less than 1 and the crystalline $As_xP_{1-x}$ has a thermopower, S, of from greater than 5.2 to 550.9 μV/K.

2. The thermoelectric device of claim 1, wherein the crystalline $As_xP_{1-x}$ is the sole active thermoelectric material for the device.

3. The thermoelectric device of claim 1, wherein the crystalline $As_xP_{1-x}$ is combined with another thermoelectric material.

4. The thermoelectric device of claim 1, wherein x is 0.2, 0.5, or 0.83.

5. The thermoelectric device of claim 1, wherein x is from 0.1 to 0.83.

6. The thermoelectric device of claim 1, wherein the crystalline $As_xP_{1-x}$ has a thermopower, S, of from 7.4 to 550.9 μV/K.

7. The thermoelectric device of claim 1, wherein the crystalline $As_xP_{1-x}$ has a power factor, S/ρ, of from greater than 5.18 to 316.54 $\mu Wm^{-1}K^{-1}$.

8. A thermoelectric device configured for use as a heat conversion and power generation structure, wherein the thermoelectric device comprises crystalline $As_xP_{1-x}$ and x is from 0.1 to less than 1 and the crystalline $As_xP_{1-x}$ has a thermopower, S, of from greater than 5.2 to 550.9 μV/K.

9. The thermoelectric device of claim 8, wherein the crystalline $As_xP_{1-x}$ produces thermoelectric power.

10. The thermoelectric device of claim 8, wherein the crystalline $As_xP_{1-x}$ is the sole active thermoelectric material for the device.

11. The thermoelectric device of claim 8, wherein the crystalline $As_xP_{1-x}$ is combined with another thermoelectric material.

12. The thermoelectric device of claim 8, wherein x is 0.2, 0.5, or 0.83.

13. The thermoelectric device of claim 8, wherein x is from 0.1 to 0.83.

14. The thermoelectric device of claim 8, wherein the crystalline $As_xP_{1-x}$ has a power factor, S/ρ, of from greater than 5.18 to 316.54 $\mu Wm^{-1}K^{-1}$.

15. A method of making crystalline $As_xP_{1-x}$ wherein x is from 0.1 to less than 1, comprising using a chemical vapor transport growth process, wherein the chemical vapor transport growth process comprises annealing phosphorous and arsenic in a reaction vessel at a temperature and under conditions sufficient to produce crystalline formation, and wherein a temperature gradient of from 40° C. to 50° C. is maintained across the ends of the reaction vessel.

16. The method of claim 15, wherein the arsenic is grey arsenic, the phosphorous is red phosphorous, or both.

17. The method of claim 15, wherein the annealing is performed under vacuum.

18. The method of claim 15, wherein the annealing is performed at a temperature of at least 600° C.

19. The method of claim 15, wherein x is 0.2, 0.5, or 0.83.

* * * * *